(12) United States Patent
Komiya

(10) Patent No.: US 11,404,430 B2
(45) Date of Patent: Aug. 2, 2022

(54) SEMICONDUCTOR MEMORY DEVICE

(71) Applicant: Kioxia Corporation, Minato-ku (JP)

(72) Inventor: Ken Komiya, Nagoya (JP)

(73) Assignee: Kioxia Corporation, Minato-ku (JP)

( * ) Notice: Subject to any disclaimer, the term of this patent is extended or adjusted under 35 U.S.C. 154(b) by 87 days.

(21) Appl. No.: 16/564,072

(22) Filed: Sep. 9, 2019

(65) Prior Publication Data
US 2020/0303406 A1 Sep. 24, 2020

(30) Foreign Application Priority Data
Mar. 20, 2019 (JP) .............................. JP2019-053324

(51) Int. Cl.
| | |
|---|---|
| *H01L 21/00* | (2006.01) |
| *H01L 27/11582* | (2017.01) |
| *H01L 29/45* | (2006.01) |
| *H01L 29/10* | (2006.01) |
| *H01L 29/49* | (2006.01) |
| *H01L 21/8234* | (2006.01) |
| *H01L 21/3215* | (2006.01) |
| *H01L 21/321* | (2006.01) |
| *G11C 16/04* | (2006.01) |

(52) U.S. Cl.
CPC .... *H01L 27/11582* (2013.01); *H01L 21/3215* (2013.01); *H01L 21/32105* (2013.01); *H01L 21/823475* (2013.01); *H01L 29/1037* (2013.01); *H01L 29/458* (2013.01); *H01L 29/495* (2013.01); *H01L 29/4908* (2013.01); *G11C 16/0483* (2013.01)

(58) Field of Classification Search
CPC ......... H01L 27/11582; H01L 21/32105; H01L 21/3215; H01L 21/823475; H01L 29/1037; H01L 29/458; H01L 29/4908
See application file for complete search history.

(56) References Cited

U.S. PATENT DOCUMENTS

| | | | |
|---|---|---|---|
| 8,582,341 B2 | 11/2013 | Fukuzumi et al. | |
| 8,860,127 B2 | 10/2014 | Cho et al. | |
| 9,406,693 B1* | 8/2016 | Pang | ........................ H01L 29/04 |
| 2015/0076580 A1* | 3/2015 | Pachamuthu | ........ H01L 27/1157 257/314 |

(Continued)

FOREIGN PATENT DOCUMENTS

JP 2013-065604 A 4/2013

*Primary Examiner* — Richard A Booth
(74) *Attorney, Agent, or Firm* — Oblon, McClelland, Maier & Neustadt, L.L.P.

(57) ABSTRACT

According to one embodiment, a semiconductor memory device includes a semiconductor substrate; a first conductor layer provided above the semiconductor substrate and including silicon; a plurality of second conductor layers provided above first conductor layer and stacked apart from each other in the first direction; and a first pillar extending in the first direction through the second conductor layers and including intersection portions where the first pillar intersects the second conductor layer, the intersection portions each functioning as a memory cell transistor, wherein the first conductor layer includes a first region which is in contact with the first pillar and includes at least one element of arsenic (As), phosphorus (P), carbon (C), or boron (B).

12 Claims, 25 Drawing Sheets

(56) References Cited

U.S. PATENT DOCUMENTS

| | | | |
|---|---|---|---|
| 2015/0102346 A1* | 4/2015 | Shin | H01L 27/11582 |
| | | | 257/66 |
| 2018/0053776 A1* | 2/2018 | Chen | H01L 21/02164 |
| 2018/0277555 A1 | 9/2018 | Fukushima et al. | |
| 2019/0103415 A1* | 4/2019 | Xiao | H01L 23/53271 |
| 2021/0126004 A1* | 4/2021 | Yamakita | H01L 27/11565 |

* cited by examiner

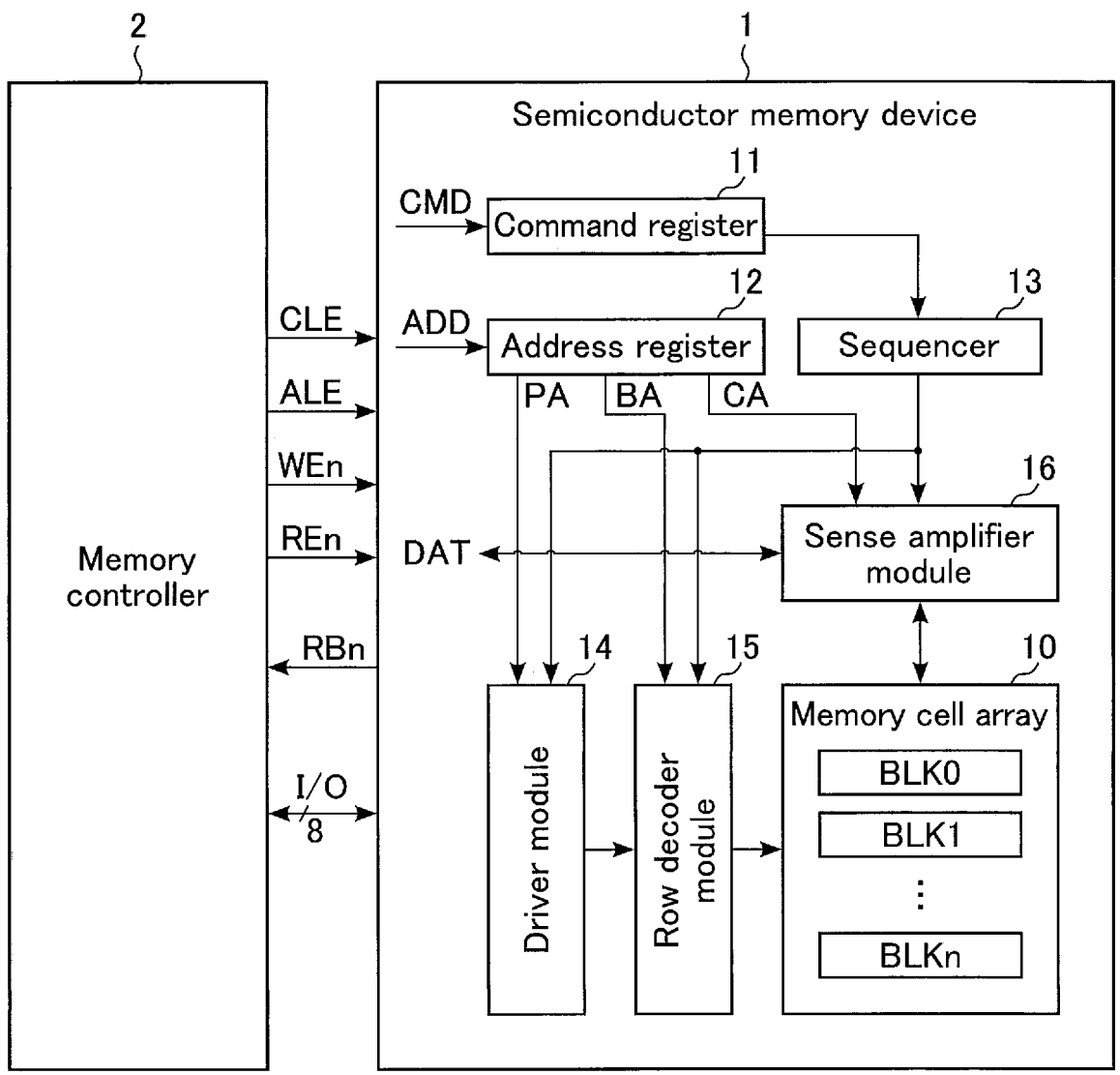
F I G. 1

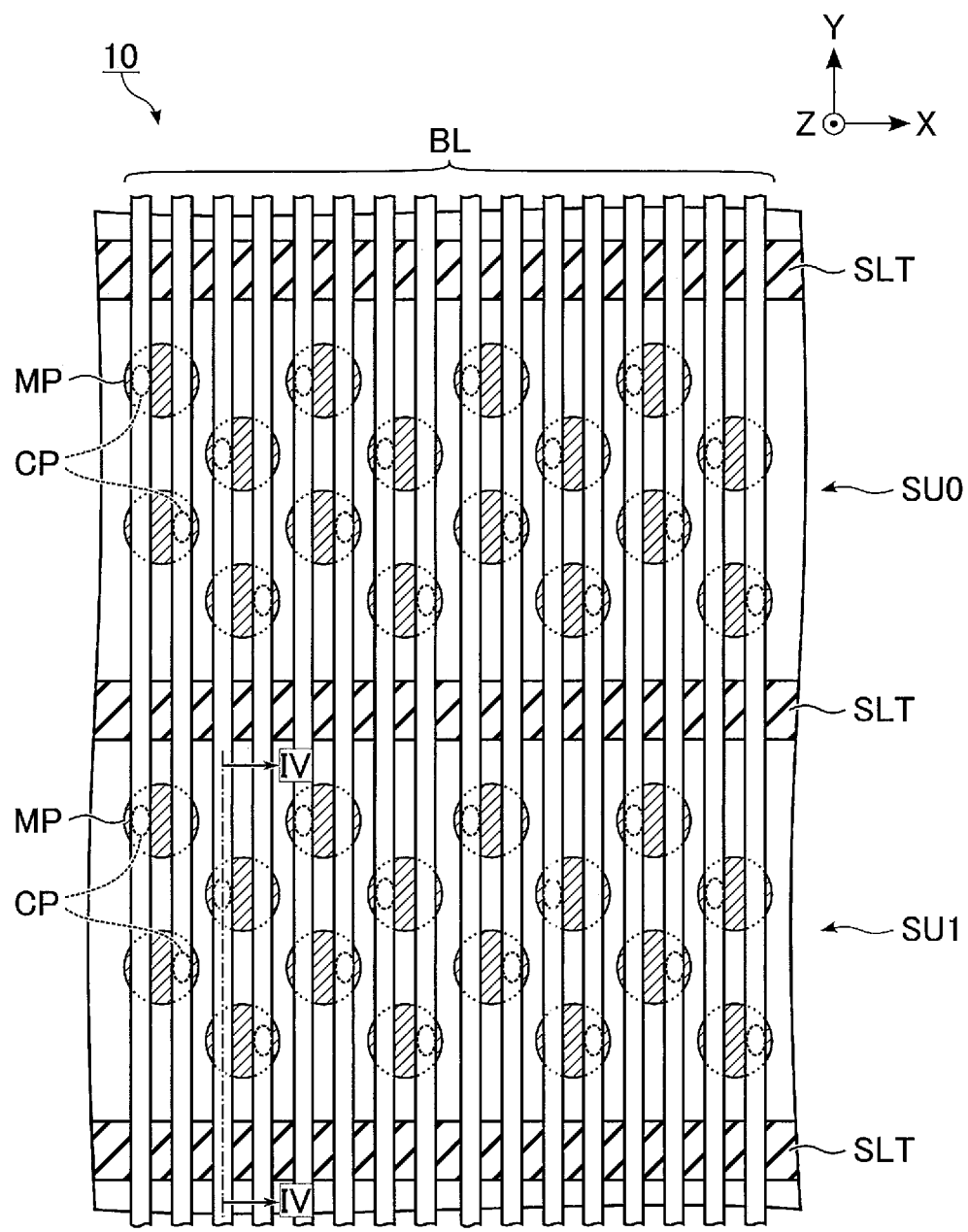
F I G. 3

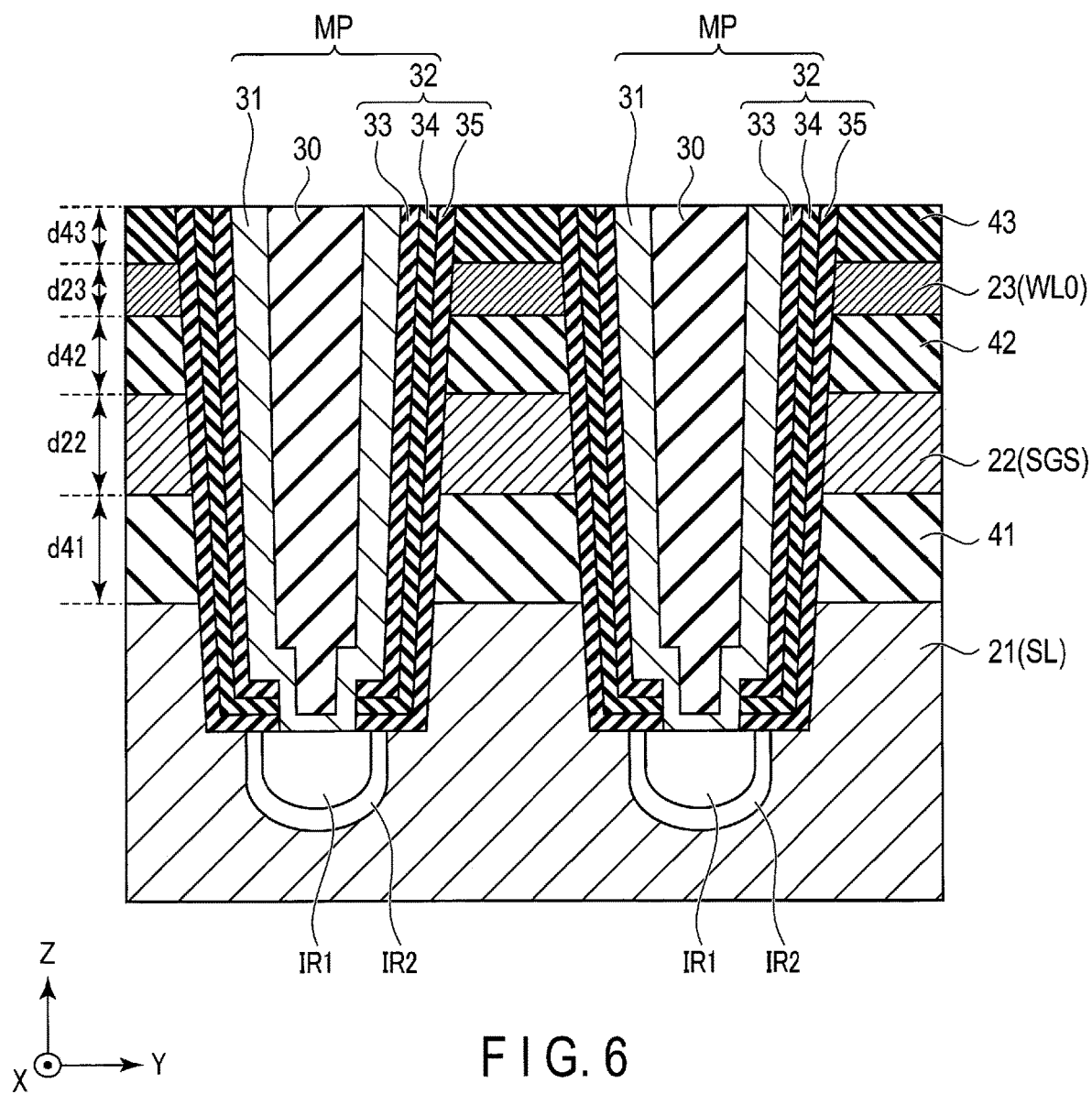
F I G. 6

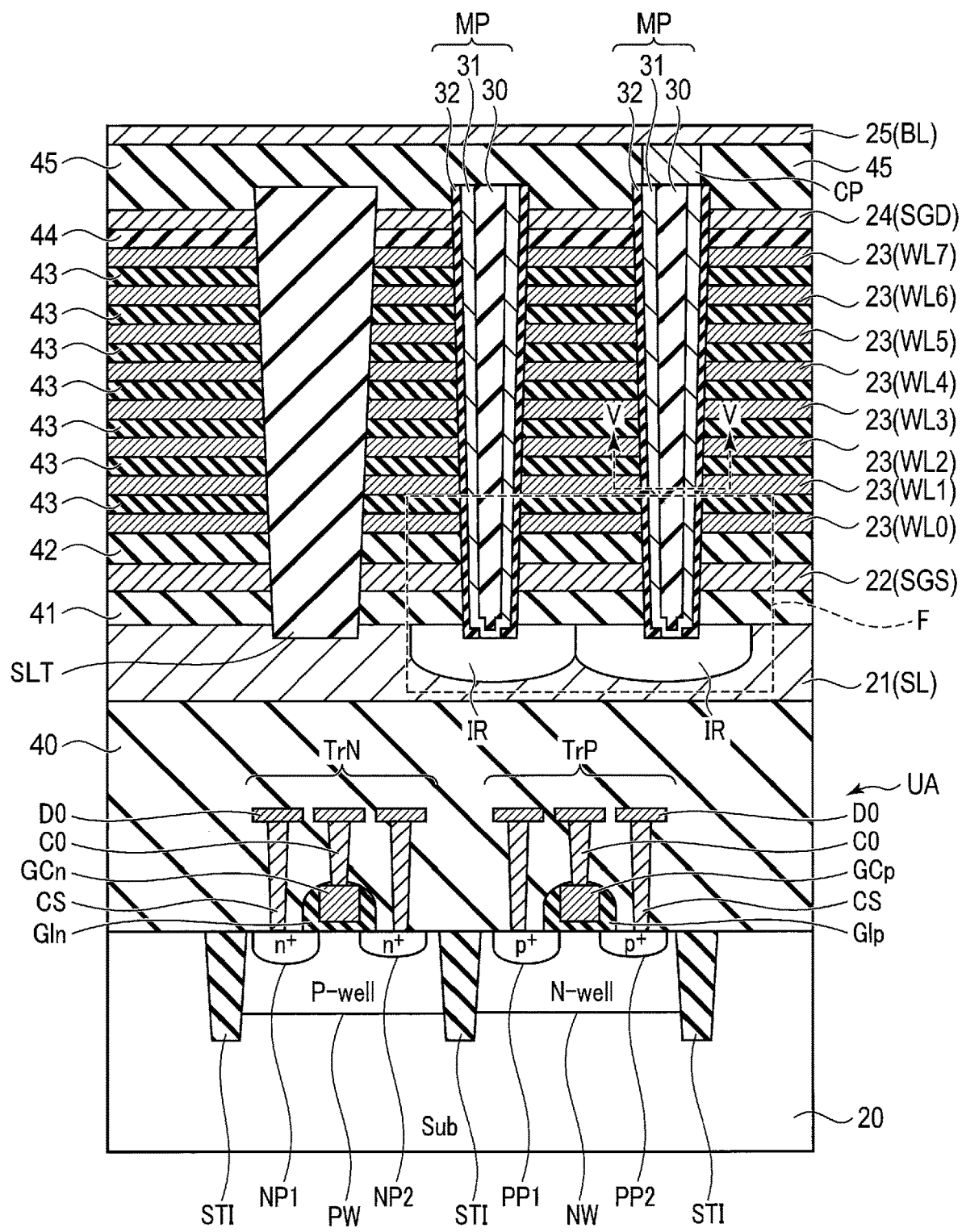
F I G. 24

SEMICONDUCTOR MEMORY DEVICE

CROSS-REFERENCE TO RELATED APPLICATIONS

This application is based upon and claims the benefit of priority from prior Japanese Patent Application No. 2019-053324, filed Mar. 20, 2019, the entire contents of which are incorporated herein by reference.

FIELD

Embodiments described herein relate generally to a semiconductor memory device.

BACKGROUND

A NAND flash memory, which can nonvolatilely store data, is known.

BRIEF DESCRIPTION OF THE DRAWINGS

FIG. 1 is a block diagram showing a configuration of a semiconductor memory device 1 according to an embodiment.

FIG. 3 is a plan view showing a layout of the memory cell array 10 included in the semiconductor memory device 1 according to the embodiment.

FIG. 6 is an enlarged cross-sectional view showing a modification of the configuration of area A around the lower part of the memory pillar MP in FIG. 4.

FIG. 24 is a cross-sectional view showing a configuration of a modification of the memory cell array 10 included in the semiconductor memory device 1 according to the embodiment.

DETAILED DESCRIPTION

Figure 2:
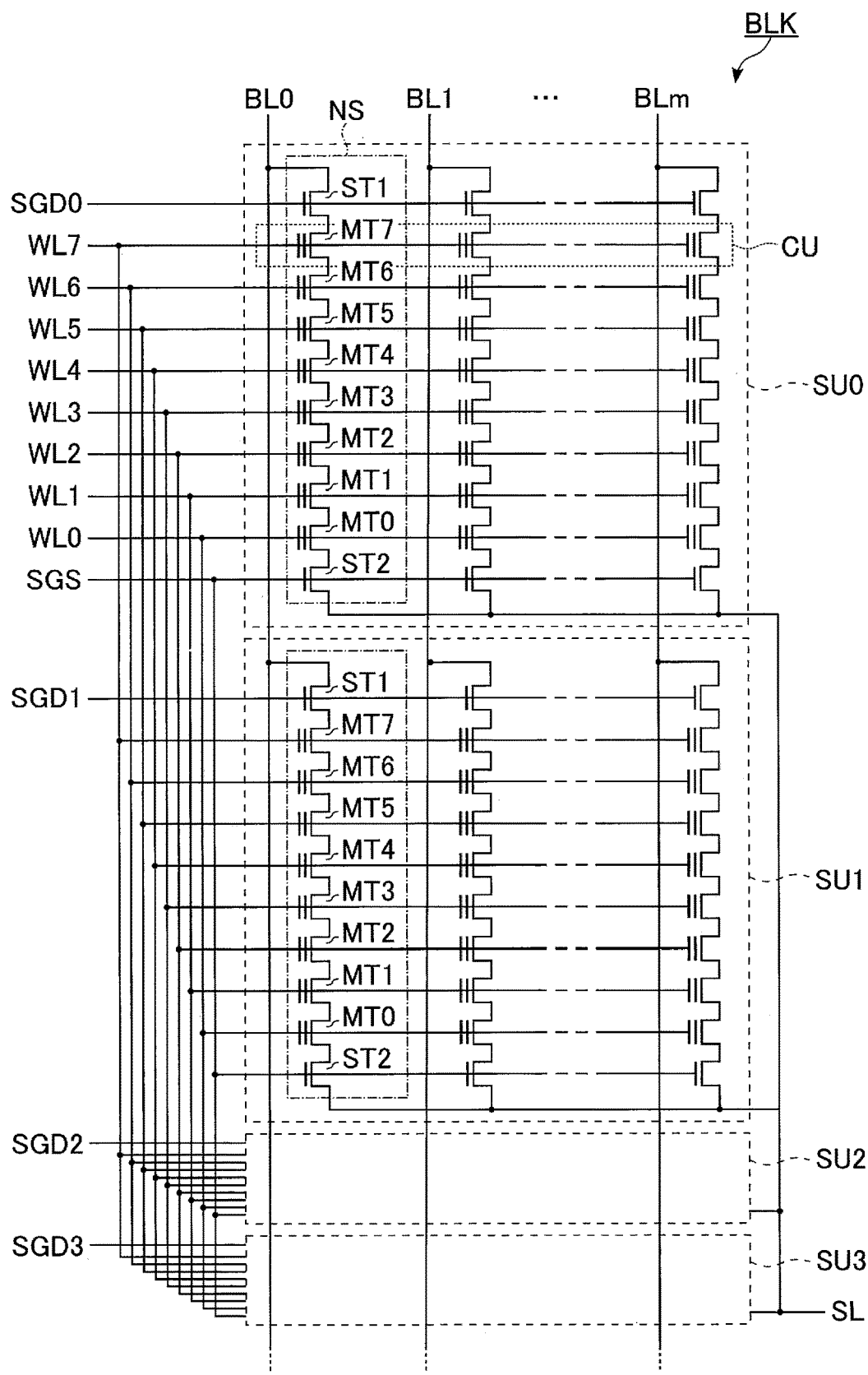
FIG. 2 is a circuit diagram showing a configuration of a memory cell array 10 included in the semiconductor memory device 1 according to the embodiment.

In general, according to one embodiment, a semiconductor memory device includes a semiconductor substrate; a first conductor layer provided above the semiconductor substrate and including silicon; a plurality of second conductor layers provided above first conductor layer and stacked apart from each other in the first direction; and a first pillar extending in the first direction through the second conductor layers and including intersection portions where the first pillar intersects the second conductor layer, the intersection portions each functioning as a memory cell transistor, wherein the first conductor layer includes a first region which is in contact with the first pillar and includes at least one element of arsenic (As), phosphorus (P), carbon (C), or boron (B).

Hereinafter, an embodiment will be described with reference to the drawings. The embodiment describes, as an example, a device or method for embodying the technical idea of the invention. The drawings are schematic or conceptual, and the dimensions and ratios, etc. in the drawings are not always the same as the actual ones. The technical idea of the invention is not specified by the shapes, configurations, arrangements, etc. of the structural elements.

In the following description, structural elements having substantially the same function and configuration will be assigned with the same reference numeral. A numeral following letters constituting a reference symbol is used for distinction between elements referred to by reference symbols including the same letters and having the same configuration. If elements represented by reference symbols <1> Embodiment FIG. 1 is a block diagram showing a configuration of a semiconductor memory device 1 according to an embodiment. Hereinafter, the semiconductor memory device 1 according to the embodiment will be described with reference to FIG. 1.

<1-1> Configuration of Semiconductor Memory Device 1

<1-1-1> Overall Configuration of Semiconductor Memory Device 1

The semiconductor memory device 1 is, for example, a NAND flash memory, which can nonvolatilely store data. The semiconductor memory device 1 is controlled by, for example, an external memory controller 2.

As shown in FIG. 1, the semiconductor memory device 1 includes a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer not less than 1). The block BLK is a set of a plurality of memory cells that can nonvolatilely store data, and is used as, for example, a data erase unit.

A plurality of bit lines and a plurality of word lines are provided in the memory cell array 10. Each memory cell is associated with, for example, one bit line and one word line. A detailed configuration of the memory cell array 10 will be described later.

The command register 11 retains a command CMD received by the semiconductor memory device 1 from the memory controller 2. The command CMD includes an instruction to instruct, for example, the sequencer 13 to perform a read operation, a write operation, an erase operation, or the like.

The address register 12 retains address information ADD received by the semiconductor memory device 1 from the memory controller 2. The address information ADD includes, for example, a block address BA, a page address PA, and a column address CA. For example, the block address BA, page address PA, and column address CA are used to select a block BLK, word line, and bit line, respectively.

The sequencer 13 controls the operation of the entire semiconductor memory device 1. For example, the sequencer 13 controls the driver module 14, the row decoder module 15, and the sense amplifier module 16, etc. based on the command CMD retained in the command register 11 to execute a read operation, a write operation, and an erase operation, etc.

The driver module 14 generates voltages used in a read operation, a write operation, and an erase operation, etc. Then, the driver module 14 applies a generated voltage to a signal line corresponding to a selected word line based on, for example, the page address PA retained in the address register 12.

Based on the block address BA retained in the address register 12, the row decoder module 15 selects one corresponding block BLK in the memory cell array 10. Then, the row decoder module 15 transfers, for example, the voltage applied to the signal line corresponding to the selected word line to the selected word line in the selected block BLK.

In a write operation, the sense amplifier module 16 applies a desired voltage to each bit line in accordance with write data DAT received from the memory controller 2. In a read operation, the sense amplifier module 16 determines data stored in a memory cell based on the voltage of the corresponding bit line, and transfers the determination result to the memory controller 2 as read data DAT.

Communication between the semiconductor memory device 1 and the memory controller 2 is based on, for example, the NAND interface standard. For example, for the communication between the semiconductor memory device 1 and the memory controller 2, a command latch enable signal CLE, an address latch enable signal ALE, a write enable signal WEn, a read enable signal REn, a ready/busy signal RBn, and an input/output signal I/O are used.

The command latch enable signal CLE is a signal that indicates that the input/output signal I/O received by the semiconductor memory device 1 is a command CMD. The address latch enable signal ALE is a signal that indicates that the input/output signal I/O received by the semiconductor memory device 1 is address information ADD. The write enable signal WEn is a signal that instructs the semiconductor memory device 1 to input therein an input/output signal I/O. The read enable signal REn is a signal that instructs the semiconductor memory device 1 to output therefrom an input/output signal I/O.

The ready/busy signal REn is a signal that notifies the memory controller 2 of whether the semiconductor memory device 1 is in a ready state in which the semiconductor memory device 1 accepts an instruction from the memory controller 2 or in a busy state in which the semiconductor memory device 1 does not accept the instruction. The input/output signal I/O is, for example, an 8-bit signal, and may include, for example, a command CMD, address information ADD, and data DAT.

The above-described semiconductor memory device 1 and memory controller 2 may constitute a single semiconductor memory device in combination. Such a semiconductor memory device includes, for example, a memory card, such as an SD™ card, and a solid state drive (SSD).

<1-1-2> Circuit Configuration of Memory Cell Array 10

FIG. 2 is a circuit diagram showing a configuration of the memory cell array 10 included in the semiconductor memory device 1 according to the embodiment. FIG. 2 shows one block BLK of a plurality of blocks BLK included in the memory cell array 10.

As shown in FIG. 2, the block BLK includes, for example, four string units SU0 to SU3. Each string unit SU includes, for example, m NAND strings NS (m is an integer not less than 1).

The m NAND strings NS are associated with respective bit lines BL0 to BLm. Each NAND string NS includes, for example, select transistor ST1, memory cell transistors MT0 to MT7, and select transistor ST2.

Each memory cell transistor MT includes a control gate and a charge storage layer, and nonvolatilely retains data. The select transistors ST1 and ST2 are each used to select a string unit SU in various operations.

The drain of select transistor ST1 of each NAND string NS is coupled to an associated bit line BL. The source of select transistor ST1 is coupled to one end of a series of the memory cell transistors MT0 to MT7. The other end of the series of the memory cell transistors MT0 to MT7 is coupled to the drain of select transistor ST2.

The sources of a plurality of select transistors ST2 of the respective NAND strings NS are coupled in common to one source line SL. The gates of a plurality of select transistors ST1 of string unit SUi ($0 \leq i \leq 3$) are coupled in common to select gate line SGDi. The control gates of a plurality of memory cell transistors MTj (0≤i≤7) of the respective string units SU are coupled in common to one word line WLj. The gates of a plurality of select transistors ST2 of the respective NAND strings NS are coupled in common to one select gate line SGS.

In the above-described circuit configuration of the memory cell array 10, one column address CA is assigned to the NAND strings NS coupled in common to each bit line BL in a plurality of blocks BLK. Select transistors ST2 in a plurality of blocks BLK are coupled in common to one source line SL.

A set of a plurality of memory cell transistors MT coupled in common to the same word line WL in one string unit SU is referred to as, for example, a cell unit CU. When each memory cell transistor MT stores 1-bit data, the storage capacity of the cell unit CU constituted by such memory cell transistors MT is called "1-page data". The cell unit CU may have a storage capacity of 2 or more-page data in accordance with the number of bits of data stored in each memory cell transistor MT.

The circuit configuration of the memory cell array 10 included in the semiconductor memory device 1 according to the embodiment is not limited to the above-described one. For example, the numbers of memory cell transistors MT, select transistors ST1, and select transistors ST2 in each NAND string NS may be any number. The number of string units SU included in each block BLK may be any number.

<1-1-3> Configuration of Memory Cell Array 10

Hereinafter, a configuration of the memory cell array 10 in the embodiment will be described.

In the figures to be referred to below, the X direction and Y direction are orthogonal directions parallel to the surface of a semiconductor substrate 20 on which the semiconductor memory device 1 is formed. For example, the X direction is a direction in which the word lines WL extend, and the Y direction is a direction in which the bit lines BL extend. The Z direction is a direction orthogonal to the surface of the semiconductor substrate 20. The X direction and Y direction are orthogonal to the Z direction.

FIG. 3 is a plan view showing a layout of the memory cell array 10 included in the semiconductor memory device 1 according to the embodiment. FIG. 3 shows a configuration of the memory cell array 10 by magnifying an area around string units SU0 and SU1.

As shown in FIG. 3, the memory cell array 10 includes a plurality of slits SLT, a plurality of string units SU, and a plurality of bit lines BL.

The slits SLT extend in the X direction, and are aligned in the Y direction. For example, one string unit SU is disposed between two slits SLT adjacent to each other in the Y direction.

Each string unit SU includes a plurality of memory pillars MP. The memory pillars MP are arranged, for example, in a zigzag in the X direction. Each memory pillar MP functions as, for example, one NAND string NS.

The bit lines BL extend in the Y direction, and are aligned in the X direction. For example, each bit line BL is disposed to overlap at least one memory pillar MP in the Z direction in each string unit SU. Specifically, as shown in, for example, FIG. 3, two bit lines BL overlap each memory pillar MP.

A contact CP is provided between a memory pillar MP and one of the bit lines BL overlapping the memory pillar MP. The contact CP electrically couples a semiconductor layer 31 (to be described later) of the memory pillar MP to the bit line BL.

The number of string units SU provided between adjacent slits SLT may be any number. The number and arrangement of memory pillars MP shown in FIG. 3 are mere examples, and may be determined at will. The number of bit lines BL overlapping each memory pillar MP in the Z direction may be any number.

Figure 4:
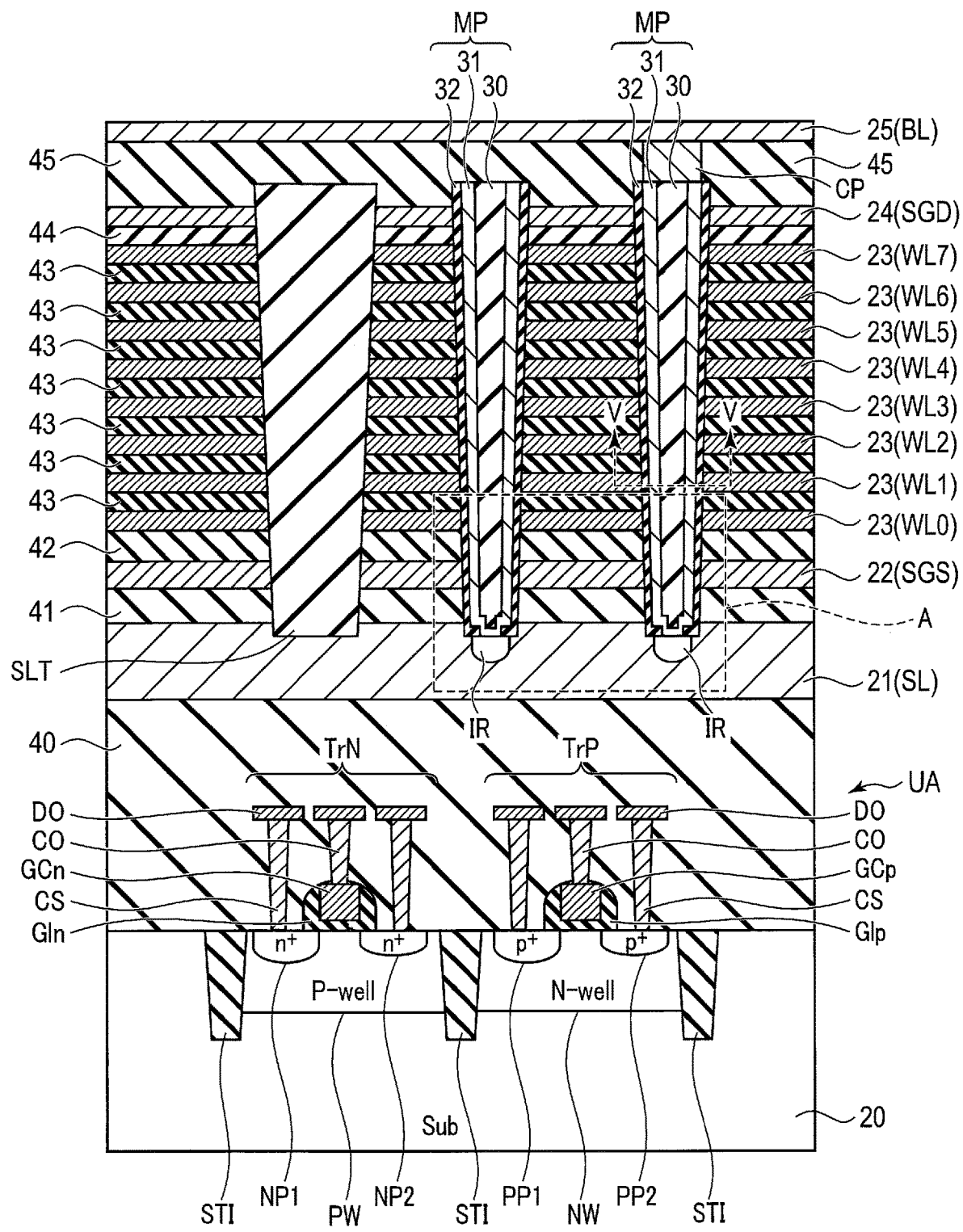
FIG. 4 is a cross-sectional view showing a configuration of the memory cell array 10 included in the semiconductor memory device 1 according to the embodiment.

FIG. 4 is a cross-sectional view taken along line IV-IV in FIG. 3, which shows a configuration of the memory cell array 10 included in the semiconductor memory device 1 according to the embodiment.

As shown in FIG. 4, the memory cell array 10 includes, for example, conductor layers 21 to 25, a memory pillar MP, a contact CP, and a slit SLT.

On the upper surface of the semiconductor substrate 20, a logic circuit UA, such as a sense amplifier module 16, is formed. The logic circuit UA includes, for example, an NMOS transistor TrN and PMOS transistor TrP, which constitute a CMOS transistor. Details of the NMOS transistor TrN and PMOS transistor TrP will be described later.

Above the logic circuit UA, a conductor layer 21 is provided with an insulator layer 40 interposed therebetween. For example, the conductor layer 21 has a plate-like shape expanding in the X direction and Y direction, and functions as a source line SL. Hereinafter, the conductor layer 21 will be referred to as a source line SL as appropriate. The conductor layer 21 includes, for example, P (phosphorus)-doped polysilicon.

Above the conductor layer 21, a conductor layer 22 is provided with an insulator layer 41 interposed therebetween. The conductor layer 22 has a plate-like shape expanding in the X direction and Y direction, and is used as select gate line SGS. Hereinafter, the conductor layer 22 will be referred to as select gate line SGS as appropriate. The conductor layer 22 includes, for example, P (phosphorus)-doped polysilicon.

Above the conductor layer 22, an insulator layer 42 is provided, and a conductor layer 23 and an insulator layer 43 are alternately provided thereon. For example, the conductor layer 23 has a plate-like shape expanding in the X direction and Y direction. A plurality of conductor layers 23 function as word lines WL0 to WL7 in order from the semiconductor substrate 20's side. Hereinafter, the conductor layers 23 will be referred to as word lines WL0 to WL7, respectively, as appropriate. The conductor layers 23 include, for example, tungsten (W).

Above the topmost conductor layer 23, a conductor layer 24 is provided with an insulator layer 44 interposed therebetween. The conductor layer 24 has, for example, a plate-like shape expanding in the X direction and Y direction, and is used as select gate line SGD. Hereinafter, the conductor layer 24 will be referred to as select gate line SGD as appropriate. The conductor layer 24 includes, for example, tungsten (W).

Above the conductor layer 24, a conductor layer 25 is provided with an insulator layer 45 interposed therebetween. For example, the conductor layer 25 is formed as a plurality of lines extending in the Y direction and aligned in the X direction, each of which functions as a bit line BL. Hereinafter, the lines of the conductor layer 25 will be referred to as bit lines BL, or collectively referred to as a bit line BL as appropriate. The conductor layer 25 includes, for example, copper (Cu).

Insulator layers 40 to 45 each include silicon oxide ($SiO_2$).

Figure 5:
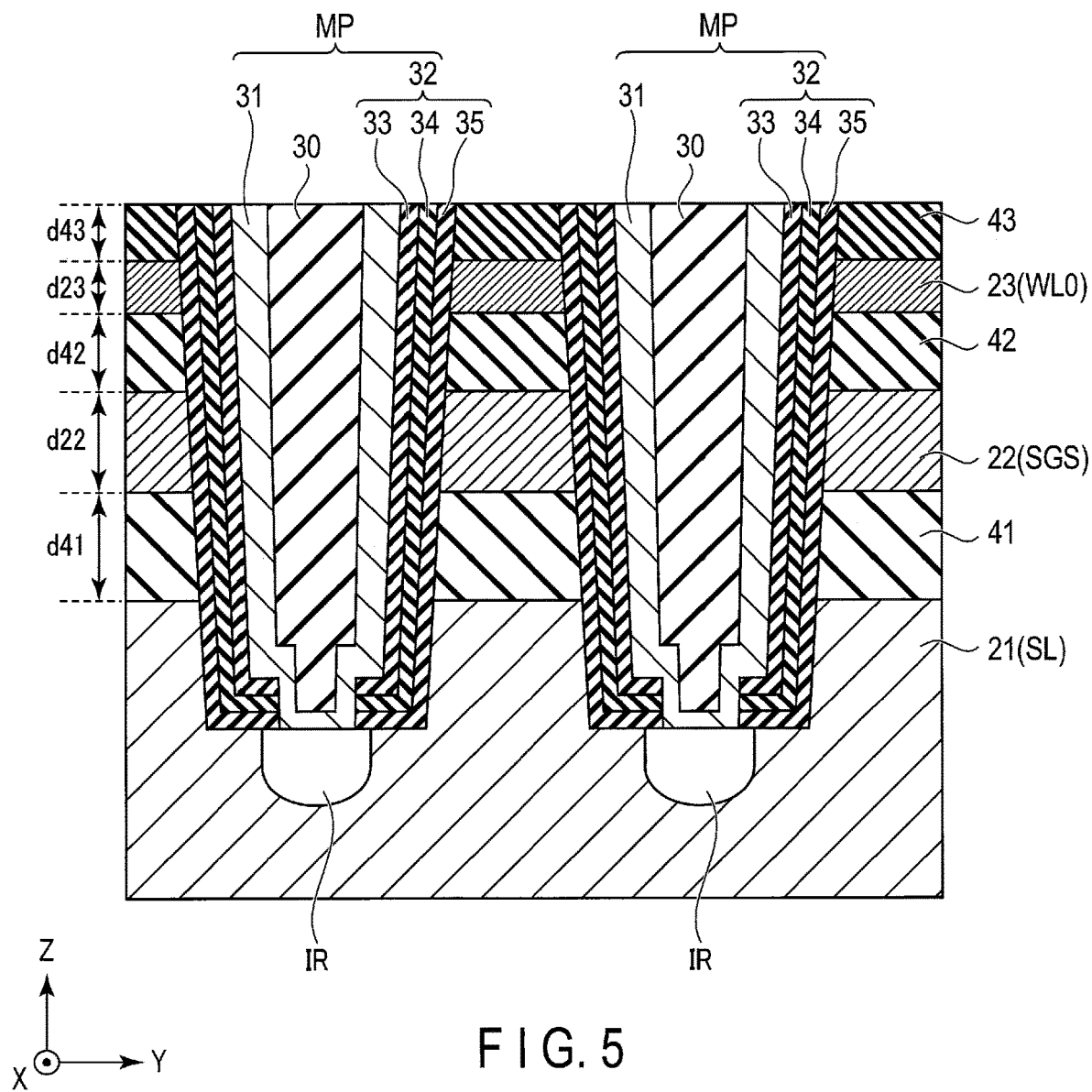
FIG. 5 is an enlarged cross-sectional view showing a configuration of area A around a lower part of a memory pillar MP in FIG. 4.

The film thickness of each layer is now described with reference to FIG. 5. As shown in FIG. 5, the film thickness $d22$ of conductor layer 22 is larger than the film thickness d23 of conductor layer 23. This is to use conductor layer 22 as an etching stopper when forming the slit SLT. This is also to make the electrical resistance of conductor layer 22, which includes polysilicon, closer to the electrical resistance of conductor layer 23, which includes tungsten having smaller electrical resistivity.

The film thickness d41 of the insulator layer 41 between the source line SL and select gate line SGS is larger than the film thickness d43 of the insulator layer 43 between adjacent word lines WL. This is to reduce the parasitic capacitance between the source line SL and select gate line SGS. The film thickness d42 of the insulator layer 42 between select gate line SGS and word line WL0 is larger than the film thickness d43 of the insulator layer 43 between adjacent word lines WL. This is to reduce the parasitic capacitance between select gate line SGS and word line WL0. The film thickness d42 of this insulator layer 42 is determined in consideration of the diffusion length of phosphorus which diffuses in the semiconductor layer 31 (to be described layer) constituting the memory pillar MP upward from the source line SL.

Next, implantation of a given element into an ion-implanted region in conductor layer 21 (source line SL), which is in contact with the lower end of the memory pillar MP, will be described with reference to FIGS. 4 to 6.

As shown in FIGS. 4 and 5, the memory pillar MP has a columnar shape extending in the Z direction, and passes through, for example, conductor layers 22 to 24. The upper end of the memory pillar MP is included in, for example, the layer in which insulator layer 45 is provided. The lower end of the memory pillar MP is included in, for example, the layer in which conductor layer 21 (source line SL) is provided.

As shown in FIG. 5, conductor layer 21 is provided with an ion-implanted region IR which is in contact with the lower end of the memory pillar MP and is doped with at least one element of arsenic (As), phosphorus (P), carbon (C), or boron (B). Accordingly, undesirable erosion of conductor layer 21 can be prevented from being caused when wet etching processing is performed in the memory hole MH as will be described later.

For example, when the ion-implanted region IR is doped with arsenic (As) and/or phosphorus (P), the contact resistance is reduced, and the cell current that flows into the memory pillar MP increases. For example, when the ion-implanted region IR is doped with carbon (C) and/or boron (B), phosphorus (P) or arsenic (As) implanted in conductor layer 21 are prevented from diffusing, and the cut-off characteristics of select gate line SGS are improved. By combining arsenic (As) and/or phosphorus (P) with carbon (C) and/or boron (B), the effects thereof are combined.

For example, as shown in FIG. 6, conductor layer 21 may be provided with an ion-implanted region IR1 which is in contact with the lower end of the memory pillar MP and is doped with arsenic (As) and/or phosphorus (P) and an ion-implanted region IR2 which includes ion-implanted region IR1 and is doped with carbon (C) and/or boron (B). In this case, thanks to the effect of arsenic (As) and/or phosphorus (P), the contact resistance can be reduced, and the cell current that flows into the memory pillar MP increases, and thanks to the effect of carbon (C) and/or boron (B), implanted arsenic (As) and/or phosphorus (P) can be prevented from diffusing. By including ion-implanted region IR1 in ion-implanted region IR2, implanted arsenic (As) and/or phosphorus (P) can be further prevented from diffusing.

A configuration of the memory pillar MP will be described with reference to FIGS. 4 to 7. As shown in FIGS. 4 to 6, the memory pillar MP includes, for example, a core member 30, a semiconductor layer 31, and a laminated film 32.

The core member 30 has a columnar shape extending in the Z-direction. The upper end of the core member 30 is included in, for example, the layer in which insulator layer 45 is provided. The lower end of the core member 30 is included in, for example, the layer in which conductor layer 21 is provided. The core member 30 includes an insulator, such as silicon oxide ($SiO_2$).

The semiconductor layer 31 covers the side and bottom surfaces of the core member 30. The semiconductor layers 31 is, for example, polysilicon (Si). The laminated film 32 covers the side and bottom surfaces of the semiconductor layer 31. The semiconductor layer 31 passes through the bottom surface of the laminated film 32, and comes into contact with conductor layer 21.

Figure 7:
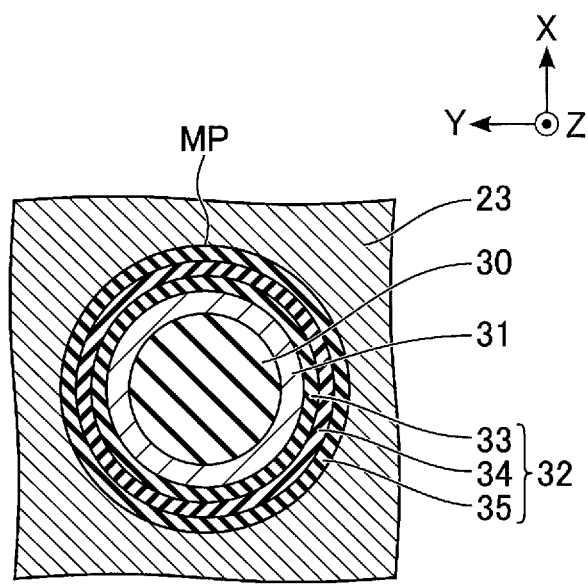
FIG. 7 is a cross-sectional view taken along line V-V in FIG. 4, which shows a configuration of the memory pillar MP in the semiconductor memory device 1 according to the embodiment.

FIG. 7 is a cross-sectional view taken along line V-V in FIG. 4. As shown in FIG. 7, the core member 30 is in the middle of the memory pillar MP in, for example, a layer in which conductor layer 23 is provided. The semiconductor layer 31 surrounds the side surface of the core member 30. The laminated film 32 surrounds the side surface of the semiconductor layer 31. The laminated film 32 includes, for example, a tunnel insulating film 33, an insulating film 34, and a block insulating film 35.

The tunnel insulating film 33 surrounds the side surface of the semiconductor layer 31. The insulating film 34 surrounds the side surface of the tunnel insulating film 33. The block insulating film 35 surrounds the side surface of the insulating film 34. The conductor layer 23 surrounds the side surface of the block insulating film 35.

The tunnel insulating film 33 includes, for example, silicon oxide ($SiO_2$). The insulating film 34 includes, for example, silicon nitride (SiN). The block insulating film 35 includes, for example, silicon oxide ($SiO_2$).

Referring back to FIG. 4, a columnar contact CP is provided on semiconductor layer 31. Although the two memory pillars MP shown in the cross section of FIG. 4 are both coupled to respective contacts CP, FIG. 4 only shows the contact CP coupled to the right memory pillar MP.

The top coupled of the contact CP is in contact with one bit line BL. The memory pillar MP may be electrically coupled to the bit line BL via two or more contacts, or via an interconnect provided in the layer in which the contact and the insulator layer 45 are provided.

The slit SLT has a plate-like shape extending in the Z direction and X direction and, for example, splits and insulates conductor layers 22 to 24 in the Y direction. Specifically, the upper end of the slit SLT is included in, for example, the layer in which insulator layer 45 is provided.

The slit SLT includes an insulator. The insulator includes, for example, silicon oxide ($SiO_2$). The slit SLT may be formed by multiple types of insulators. For example, before silicon oxide is filled in a groove for forming the slit SLT, silicon nitride (SiN) may be formed as a side wall of the slit SLT.

In the above-described configuration of the memory pillar MP, for example, the portion where the memory pillar MP intersects conductor layer 22 functions as select transistor ST2. The portion where the memory pillar MP intersects conductor layer 23 functions as a memory cell transistor MT. The portion where the memory pillar MP intersects conductor layer 24 functions as select transistor ST1.

Namely, semiconductor layer 31 functions as the channel of each of the memory cell transistors MT, select transistor ST1, and select transistor ST2. The insulating film 34 functions as a charge storage layer of the memory cell transistor MT.

In the above-described configuration of the memory cell array 10, the number of conductor layers 23 is designed based on the number of word lines WL. There may be multiple select gate lines SGD (conductor layers 24). There may be multiple select gate lines SGS (conductor layers 22). When there are multiple conductor layers 22, a conductor different from phosphorus (P)-doped polysilicon, for example, a metal such as tungsten (W), may be used for the layers other than the lowest layer.

<1-1-4> Configurations of NMOS Transistor TrN and PMOS Transistor TrP

Hereinafter, the configuration of each of the NMOS Transistor TrN and PMOS Transistor TrP will be described.

First, the configuration of each of the NMOS Transistor TrN and PMOS Transistor TrP under the memory cell array 10 will be described with continued reference to FIG. 4.

In the semiconductor substrate 20, for example, a P-type well region PW, an N-type well region NW, and an element isolation region STI are formed.

The P-type well region PW, N-type well region NW, and element isolation region STI are each in contact with the top surface of the semiconductor substrate 20. The element isolation region STI insulates the N-type well region NW from the P-type well region PW.

The P-type well region PW includes source/drain regions NP1 and NP2 each formed by diffusing an $n^+$ impurity. Source/drain region NP1 is apart from source/drain region NP2. The source/drain regions NP1 and NP2 are each in contact with the top surface of the semiconductor substrate 20. The source/drain regions NP1 and NP2 are each doped with, for example, phosphorus (P).

The N-type well region NW includes source/drain regions PP1 and PP2 each formed by diffusing a $p^+$ impurity. Source/drain region PP1 is apart from source/drain region PP2. The source/drain regions PP1 and PP2 are each in contact with the top surface of the semiconductor substrate 20. The source/drain regions PP1 and PP2 are each doped with, for example, boron (B).

Gate electrode GCn is provided above the P-type well region PW between source/drain region NP1 and source/drain region NP2. Gate insulating film GIn is provided between gate electrode GCn and the P-type well region PW. Gate electrode GCp is provided above the N-type well region NW between source/drain region PP1 and source/drain region PP2. Gate insulating film GIp is provided between gate electrode GCp and the N-type well region NW.

Conductors DO are interconnects electrically coupled to, for example, the memory cell array 10, and are provided above gate electrode GCn and gate electrode GCp.

Contacts CS are columnar conductors extending in the Z direction between source/drain region NP1, source/drain region NP2, source/drain region PP1, and source/drain region PP2 and the respective conductors DO. Contacts CO are columnar conductors extending in the Z direction between gate electrode GCn and gate electrode GCp and the respective conductors DO.

Contacts CS electrically couple source/drain region NP1, source/drain region NP2, source/drain region PP1, and source/drain region PP2 with the respective conductors DO. Contacts CO electrically couple gate electrode GCn and gate electrode GCp with the respective conductors DO.

<1-2> Method for Manufacturing Semiconductor Memory Device 1

Figure 8:
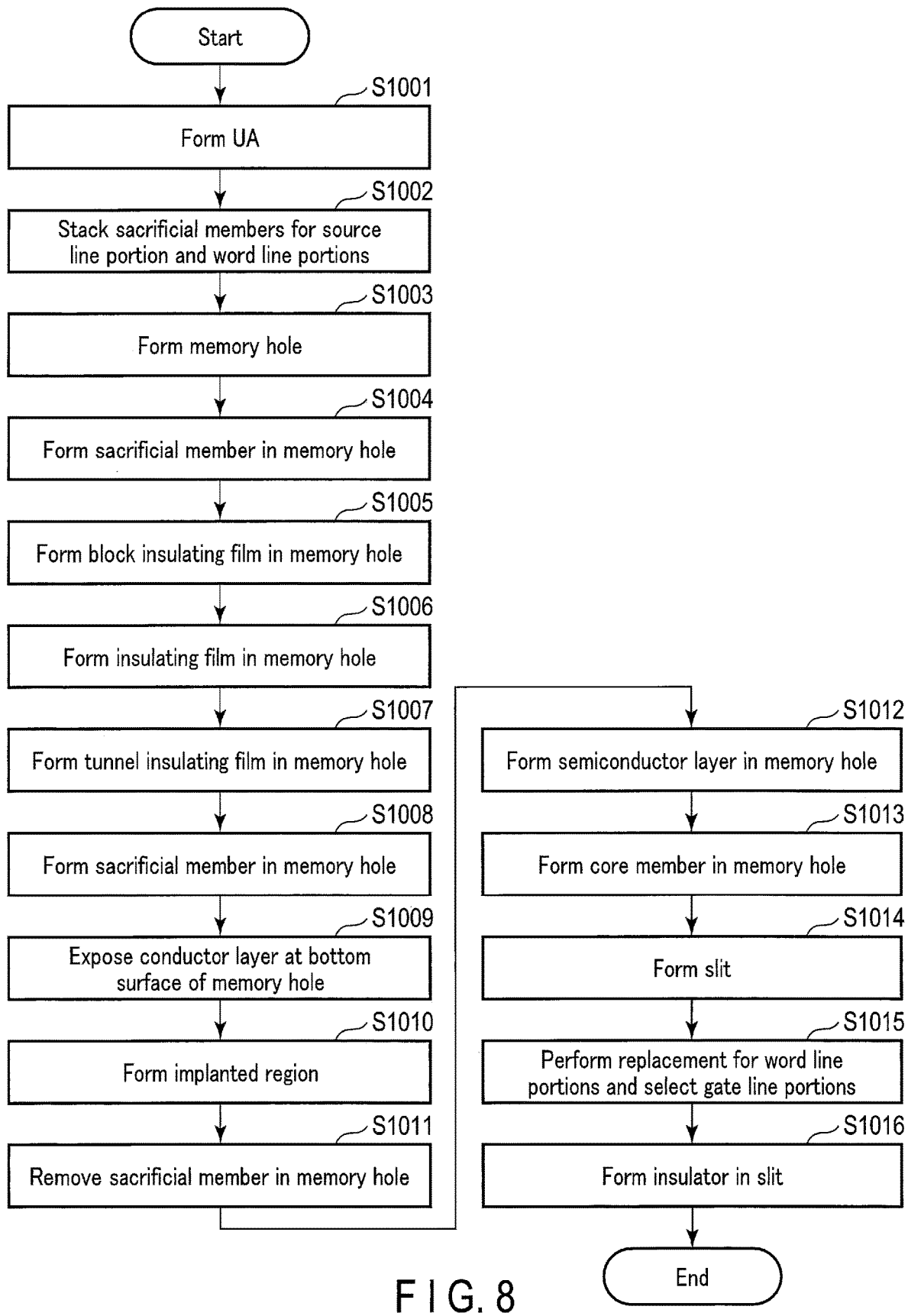
FIG. 8 is a flowchart showing manufacturing steps of the semiconductor memory device 1 according to the embodiment.

Hereinafter, a series of manufacturing steps from formation of the source line SL to formation of the slit SLT in the semiconductor memory device 1 according to the embodiment will be described with reference to FIG. 8 as appropriate. FIG. 8 is a flowchart showing a method for manufacturing the semiconductor memory device 1 according to the embodiment. FIGS. 9 to 23 show cross-section configurations respectively including structures corresponding to the memory cell array 10 in respective manufacturing steps of the semiconductor memory device 1 according to the embodiment. Description will be provided while focusing on the memory cell array 10 provided above the logic circuit UA. Therefore, detailed description relating to the logic circuit UA will be omitted.

[Step S1001]

First, a logic circuit UA, which includes a circuit corresponding to the sense amplifier module 16, etc., is formed on a semiconductor substrate.

[Step S1002]

Figure 9:
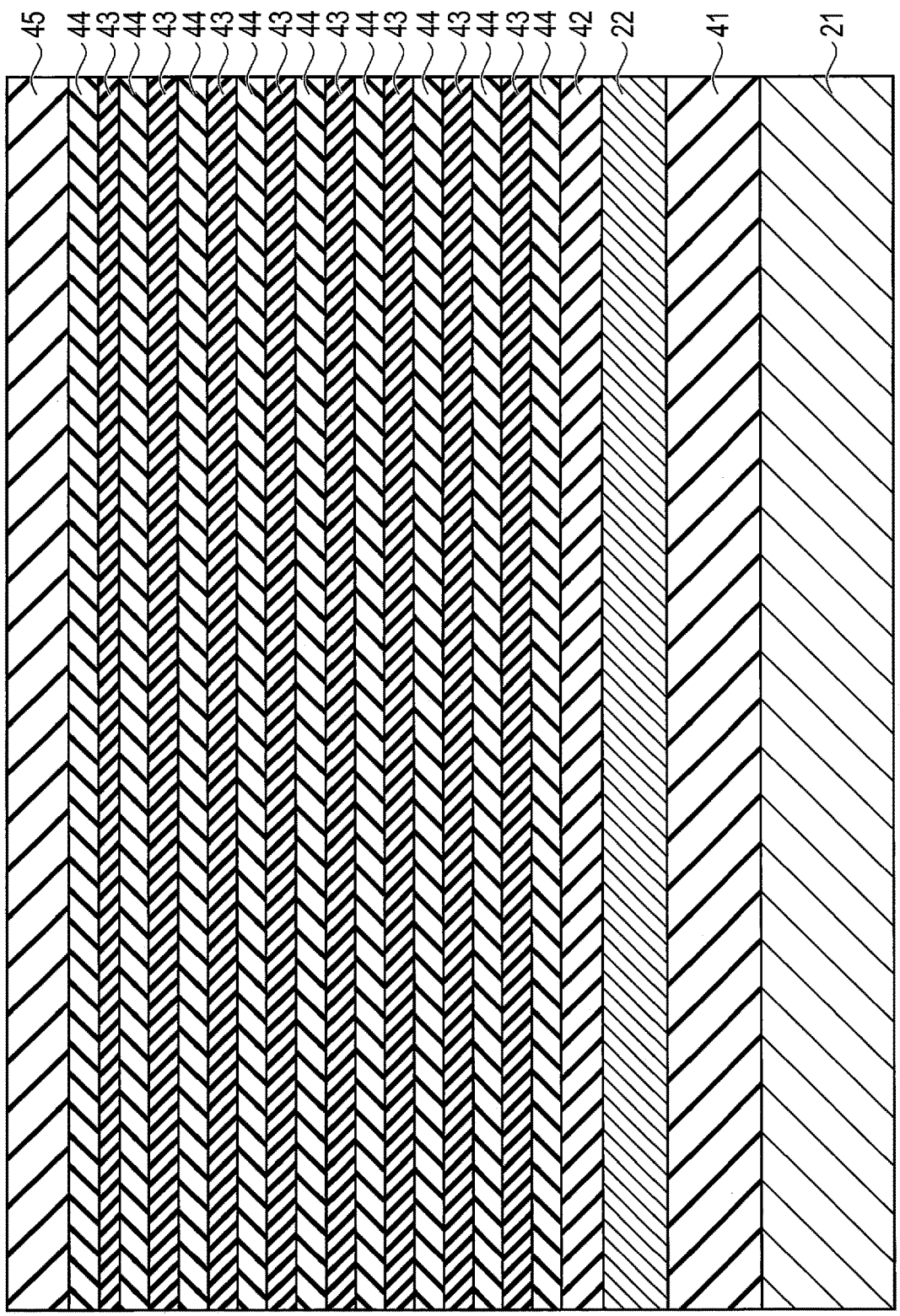
FIG. 9 is a cross-sectional view of the memory cell array 10 for illustrating a manufacturing step of the semiconductor memory device 1 according to the embodiment.

Sacrificial members for a source line portion and word line portions are stacked on the logic circuit UA. Specifically, as shown in FIG. 9, conductor layer 21, insulator layer 41, conductor layer 22, and insulator layer 42 are formed in order on the logic circuit UA (not shown). On insulator layer 42, sacrificial member 44 and insulator layer 43 are alternately stacked. On the topmost sacrificial member 44, insulator layer 45 is formed.

Conductor layer 21 is the source line portion. Conductor layer 21 includes, for example, polysilicon (Si). Insulator layers 41, 42, 43, and 45 each include, for example, silicon oxide ($SiO_2$). Each sacrificial member 44 is replaced in a later step to form a word line portion. For example, the number of layers of sacrificial members 44 corresponds to the number of stacked word lines WL. The sacrificial members 44 include, for example, silicon nitride (SiN).

[Step S1003]

Figure 10:
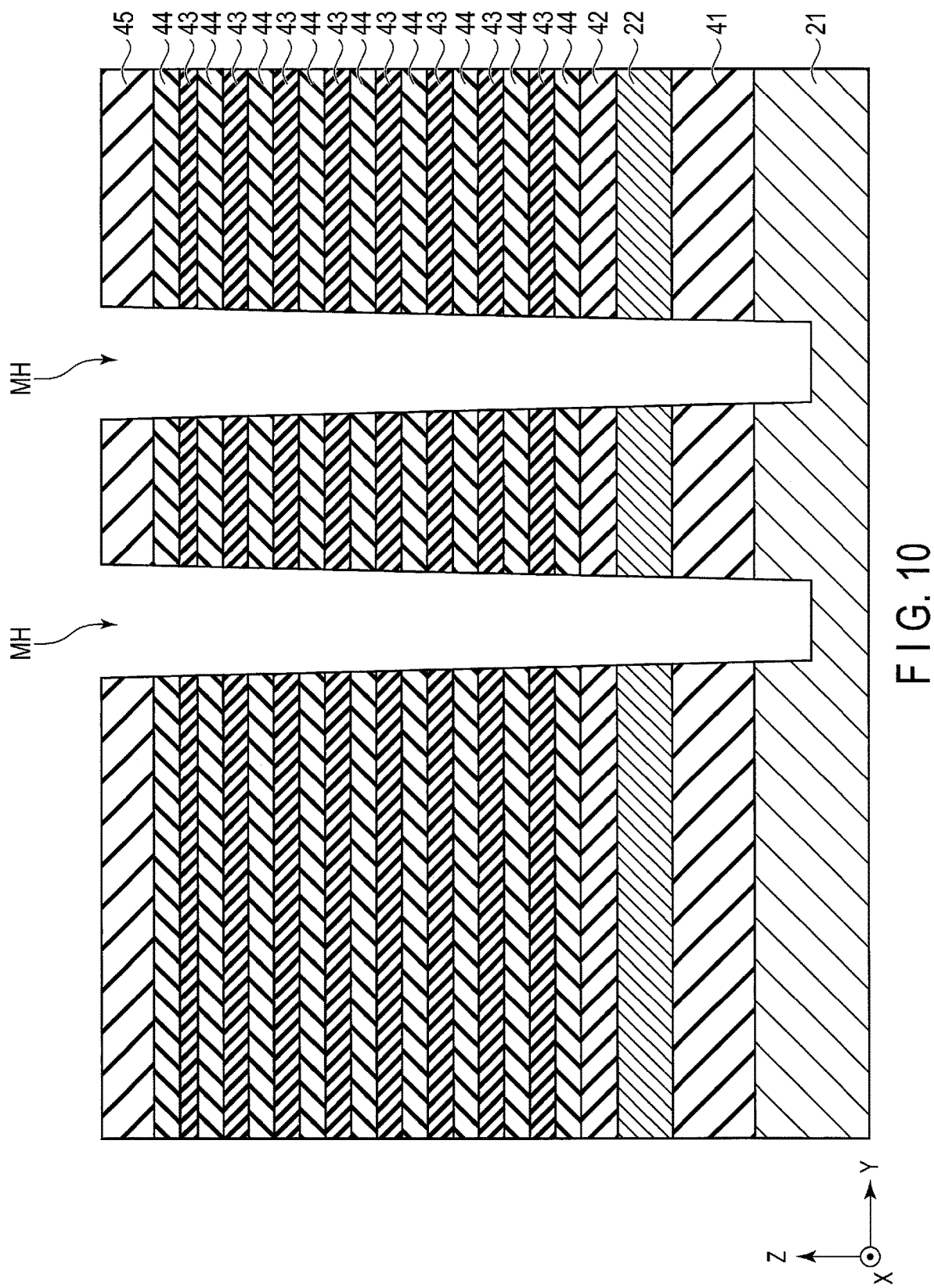
FIG. 10 is a cross-sectional view of the memory cell array 10 for illustrating a manufacturing step of the semiconductor memory device 1 according to the embodiment.

Next, a memory hole MH is formed. Specifically, a mask (not shown) including an opening corresponding to a memory hole MH is formed by, for example, photolithography. Then, as shown in FIG. 10, a memory hole MH is formed by anisotropic etching using the formed mask.

The memory hole MH formed in this step passes through insulator layers 41, 42, 43, and 45, sacrificial members 44, and conductor layer 22 so that the bottom of the memory hole MH is placed, for example, within conductor layer 21. The anisotropic etching in this step is, for example, reactive ion etching (RIE).

[Step S1004]

Figure 11:
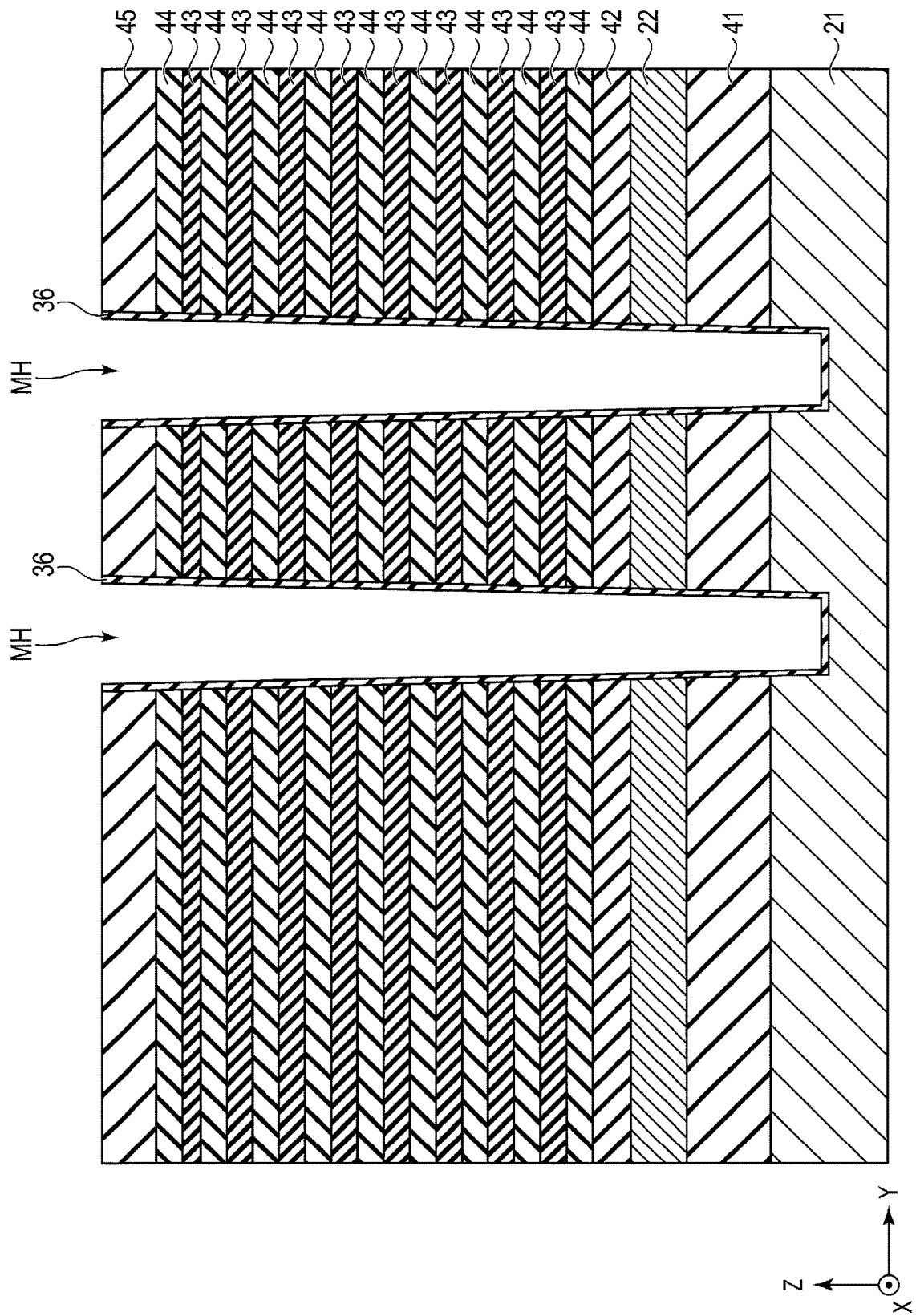
FIG. 11 is a cross-sectional view of the memory cell array 10 for illustrating a manufacturing step of the semiconductor memory device 1 according to the embodiment.

A sacrificial member 36 is formed in the memory hole MH. Specifically, as shown in FIG. 11, silicon nitride (SiN) is formed on the side and bottom surfaces of the memory hole MH as the sacrificial member 36.

[Step S1005]

Figure 12:
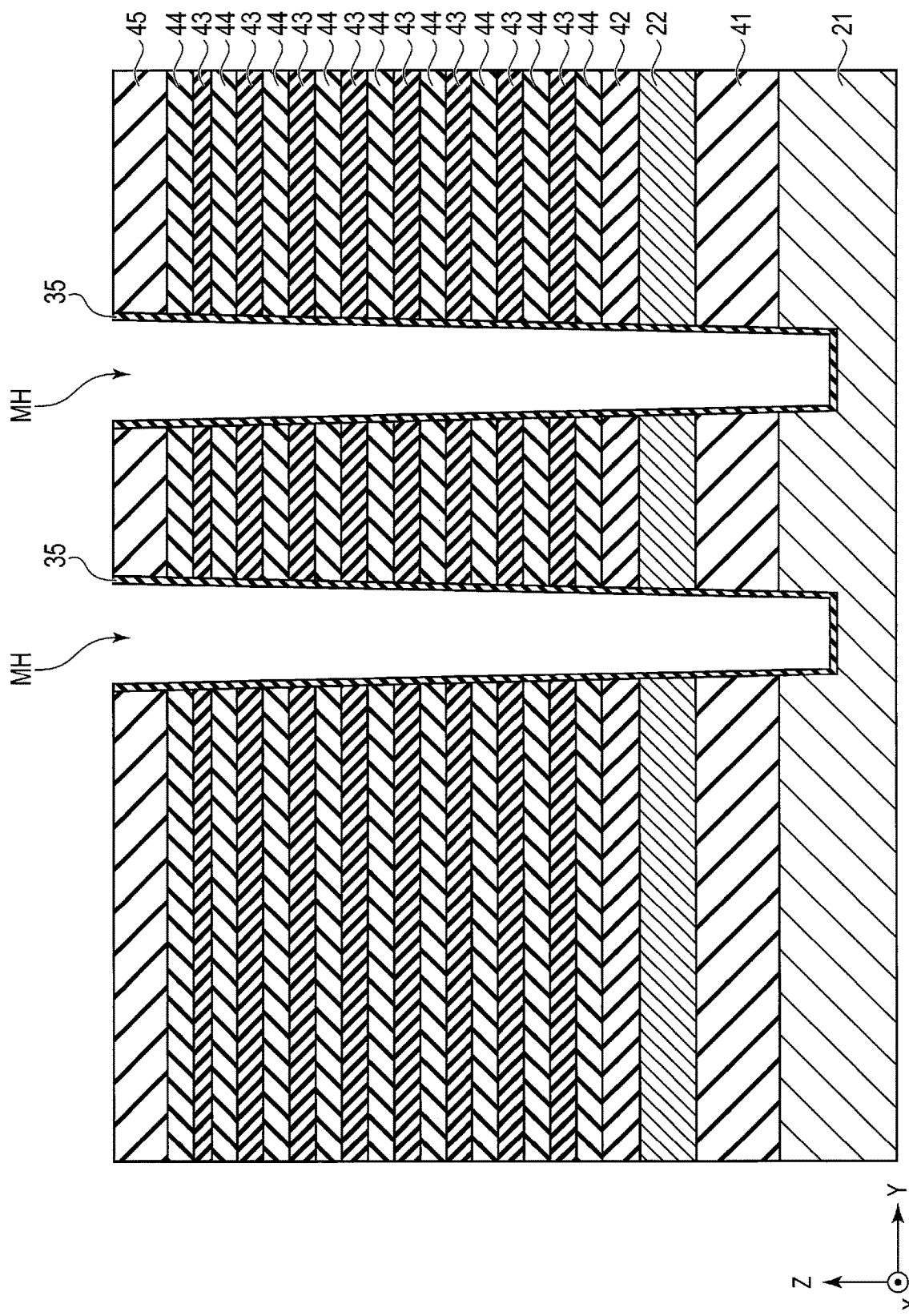
FIG. 12 is a cross-sectional view of the memory cell array 10 for illustrating a manufacturing step of the semiconductor memory device 1 according to the embodiment.

A block insulating film 35 is formed in the memory hole MH. Specifically, as shown in FIG. 12, the sacrificial member 36 formed on the side and bottom surfaces of the memory hole MH is oxidized to form silicon oxide ($SiO_2$) as the block insulating film 35.

[Step S1006]

Figure 13:
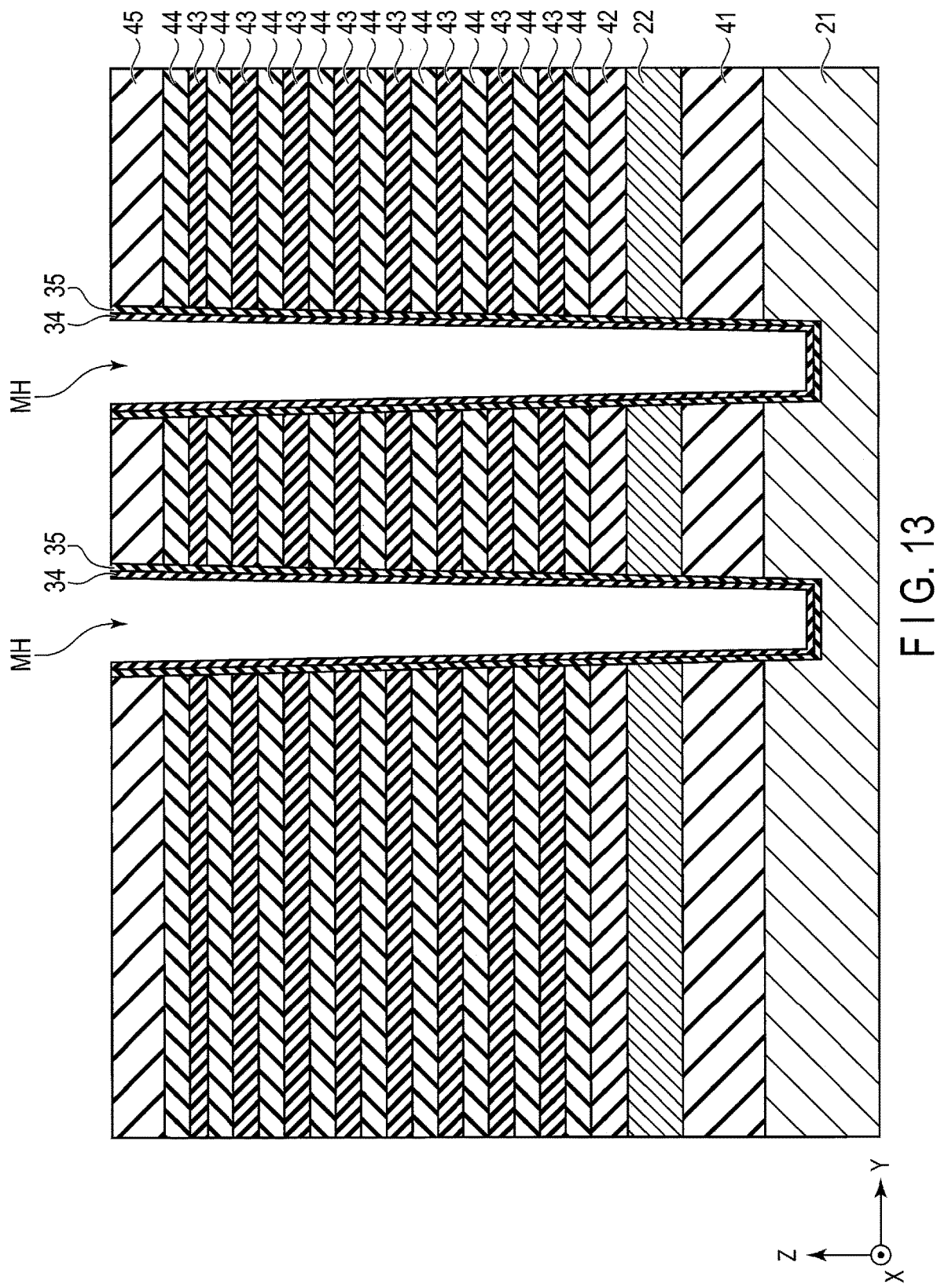
FIG. 13 is a cross-sectional view of the memory cell array 10 for illustrating a manufacturing step of the semiconductor memory device 1 according to the embodiment.

An insulating film 34 is formed in the memory hole MH. Specifically, as shown in FIG. 13, silicon nitride is formed as the insulating film 34 on the block insulating film 35 formed on the side and bottom surfaces of the memory hole MH.

[Step S1007]

Figure 14:
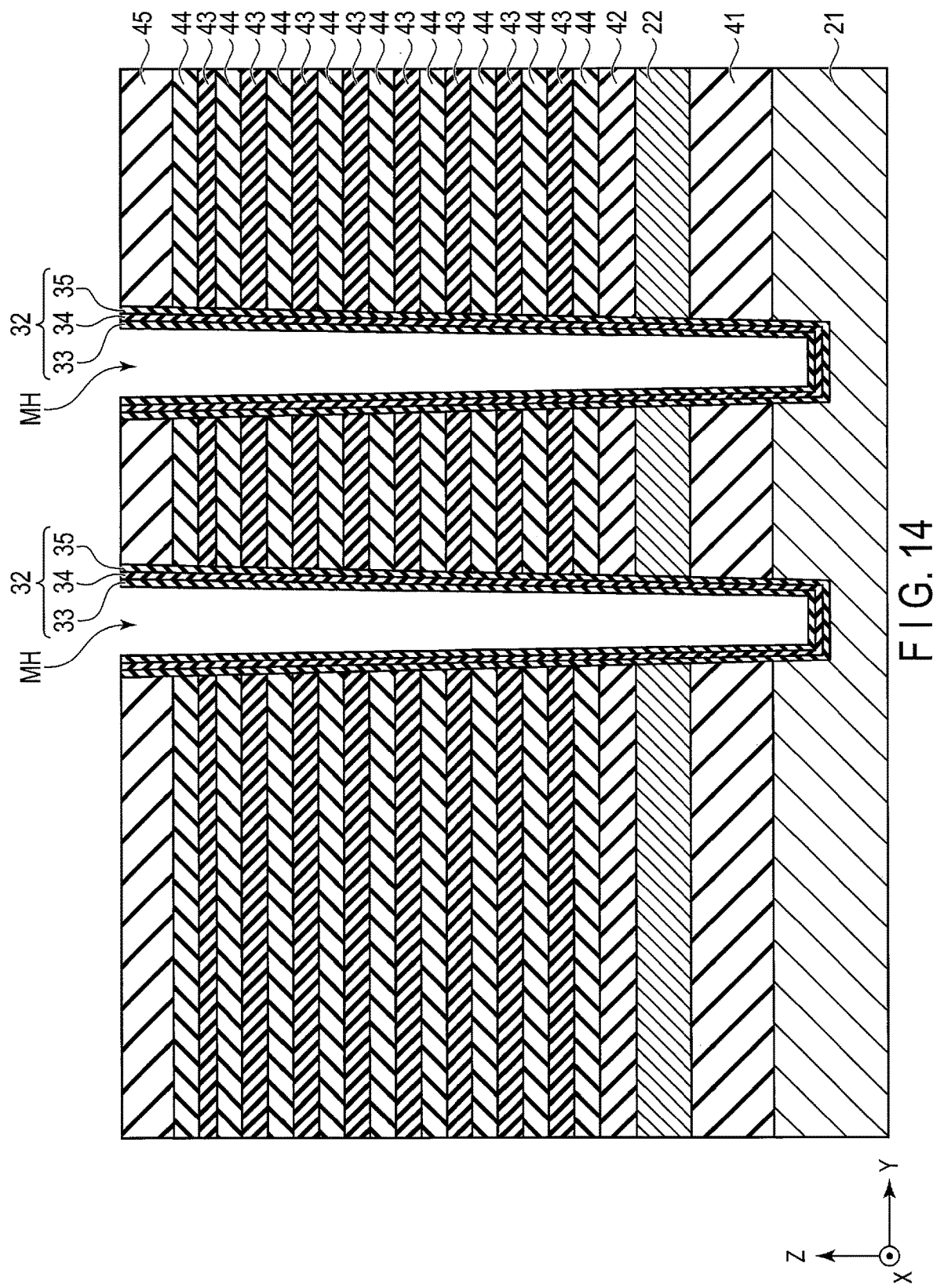
FIG. 14 is a cross-sectional view of the memory cell array 10 for illustrating a manufacturing step of the semiconductor memory device 1 according to the embodiment.

A tunnel insulating film 33 is formed in the memory hole MH. Specifically, as shown in FIG. 14, silicon oxide (SiO$_2$) is formed as the tunnel insulating film 33 on the insulating film 34 formed on the side and bottom surfaces of the memory hole NH.

[Step S1008]

Figure 15:
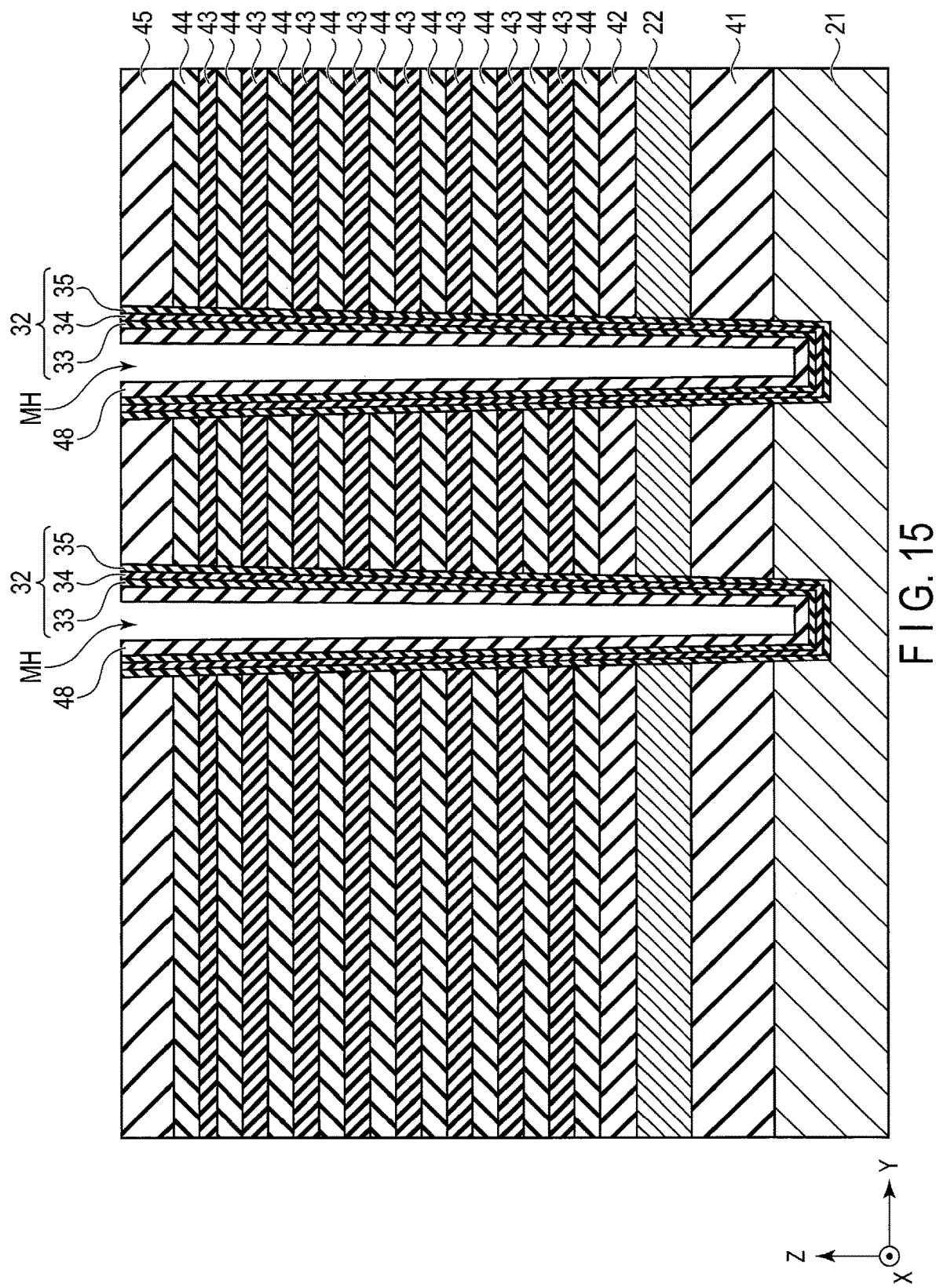
FIG. 15 is a cross-sectional view of the memory cell array 10 for illustrating a manufacturing step of the semiconductor memory device 1 according to the embodiment.

A sacrificial member 48 is formed in the memory hole MH. Specifically, as shown in FIG. 15, a sacrificial member 48 is formed on the tunnel insulating film 33. Then, the sacrificial member 48 and laminated film 32 formed outside the memory hole MH are removed by, for example, chemical mechanical polishing (CMP). The sacrificial member 48 is, for example, amorphous silicon (aSi).

[Step S1009]

Figure 16:
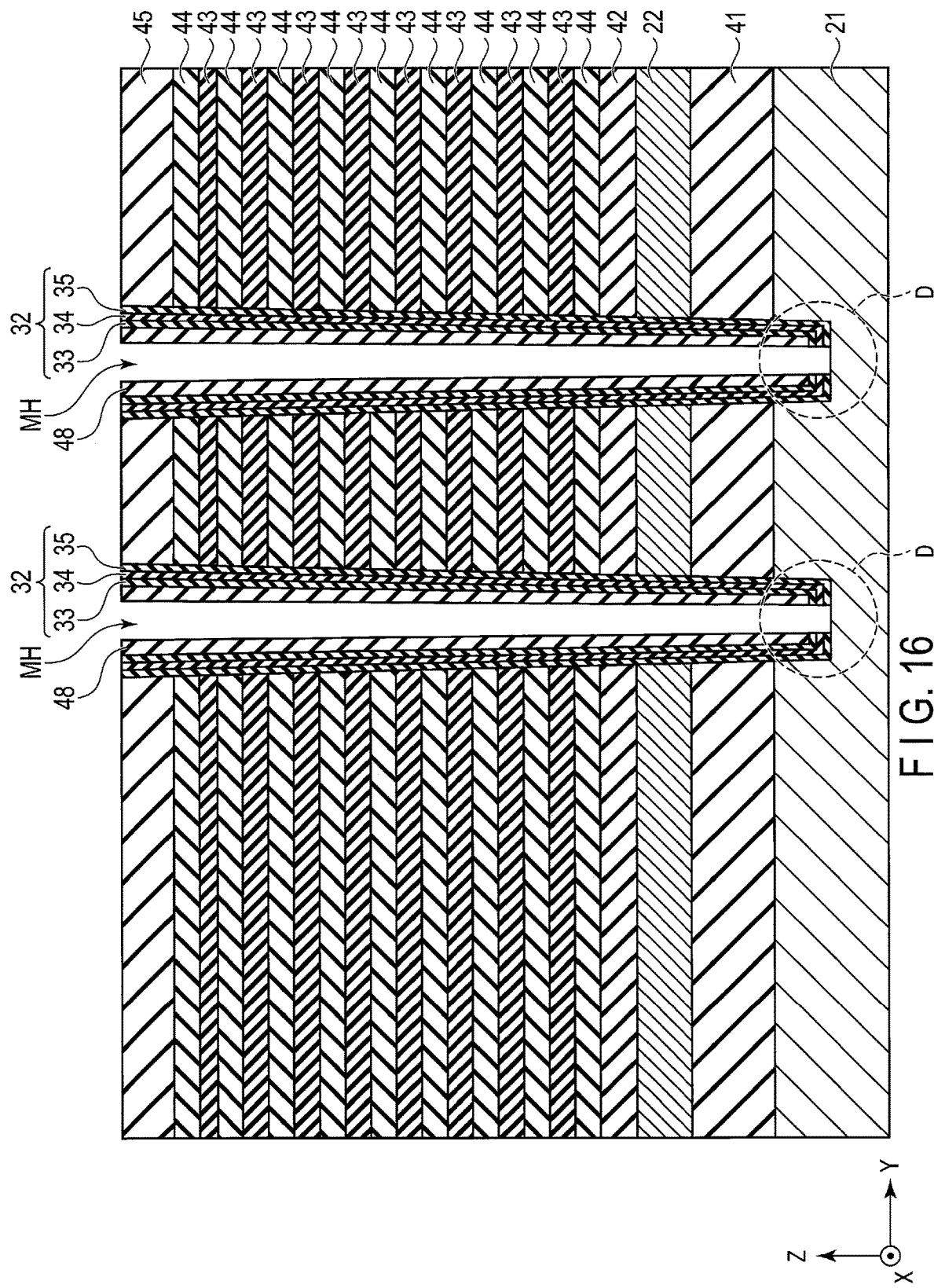
FIG. 16 is a cross-sectional view of the memory cell array 10 for illustrating a manufacturing step of the semiconductor memory device 1 according to the embodiment.

Next, the conductor layer 21 on the bottom surface of the memory hole MH is exposed (also referred to as bottom removal). Specifically, as shown in FIG. 16, a mask (not shown) including an opening corresponding to the memory hole MH is formed by, for example, photolithography. Then, the sacrificial member 48 and laminated film 32 formed on the bottom surface of the memory hole MH are removed by anisotropic etching using the formed mask. Accordingly, the conductor layer 21 is exposed at the bottom surface of the memory hole MH (see D in the figure).

[Step S1010]

Figure 17:
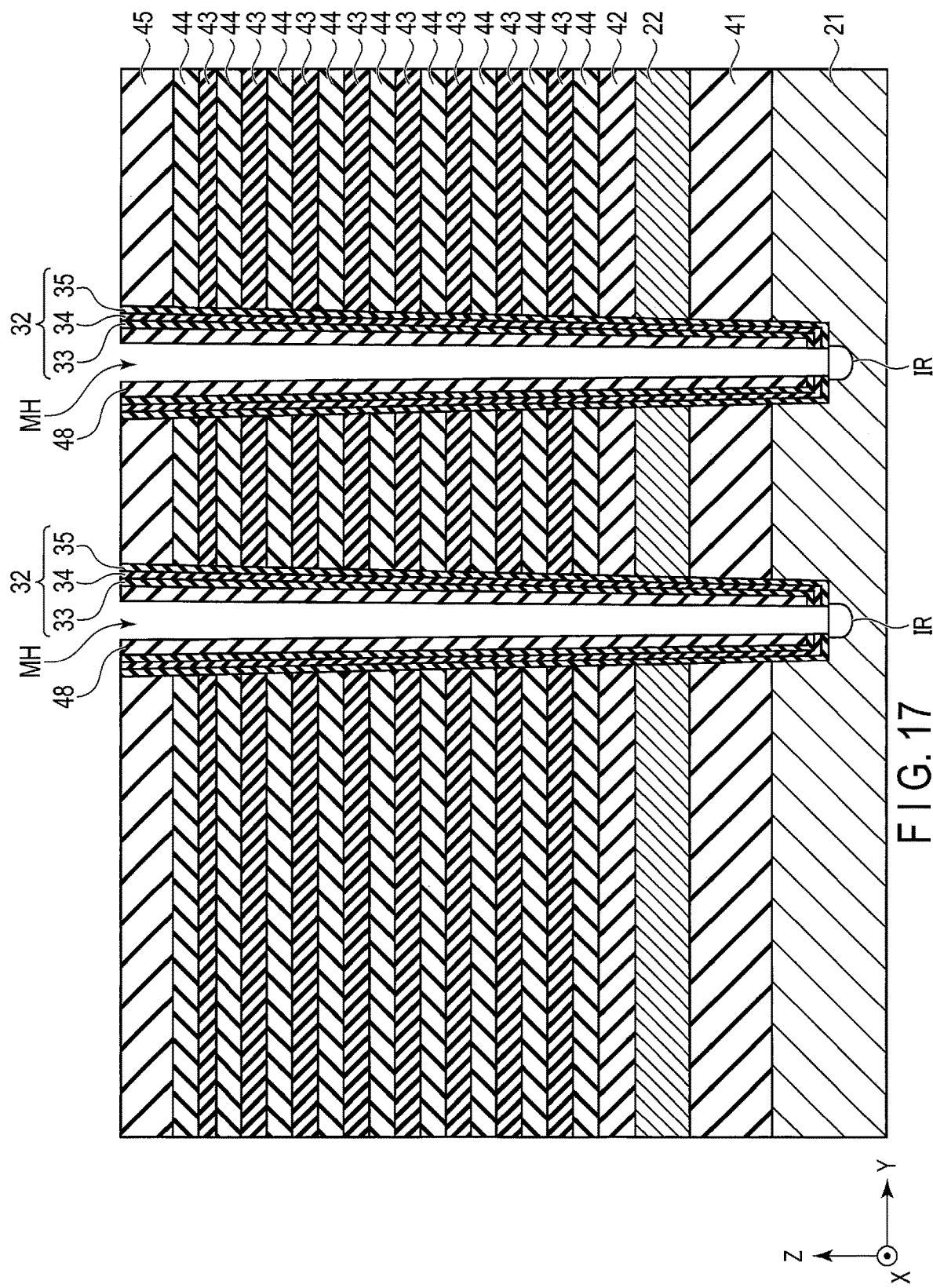
FIG. 17 is a cross-sectional view of the memory cell array 10 for illustrating a manufacturing step of the semiconductor memory device 1 according to the embodiment.

Next, an ion-implanted region IR is formed in the conductor layer 21 on the bottom surface of the memory hole MH. Specifically, as shown in FIG. 17, a given type of ion (for example, at least one of arsenic (As), phosphorus (P), carbon (C), or boron (B)) is implanted into the conductor layer 21 exposed at the bottom surface of the memory hole MH under the conditions of 50 keV and dose of 2E15 or the like. The region of the conductor layer 21 in which a given type of ion is implanted is thereby changed into amorphous and becomes an ion-implanted region IR. The amorphous region of the conductor layer 21 has a lower etching rate than the other region of the conductor layer 21, which is not changed into amorphous. By increasing the dose of the implanted ion, the etching rate can be further lowered.

After this step, plasma oxidization may be performed to slightly oxidize amorphous silicon although it is not described here in detail.

[Step S1011]

Figure 18:
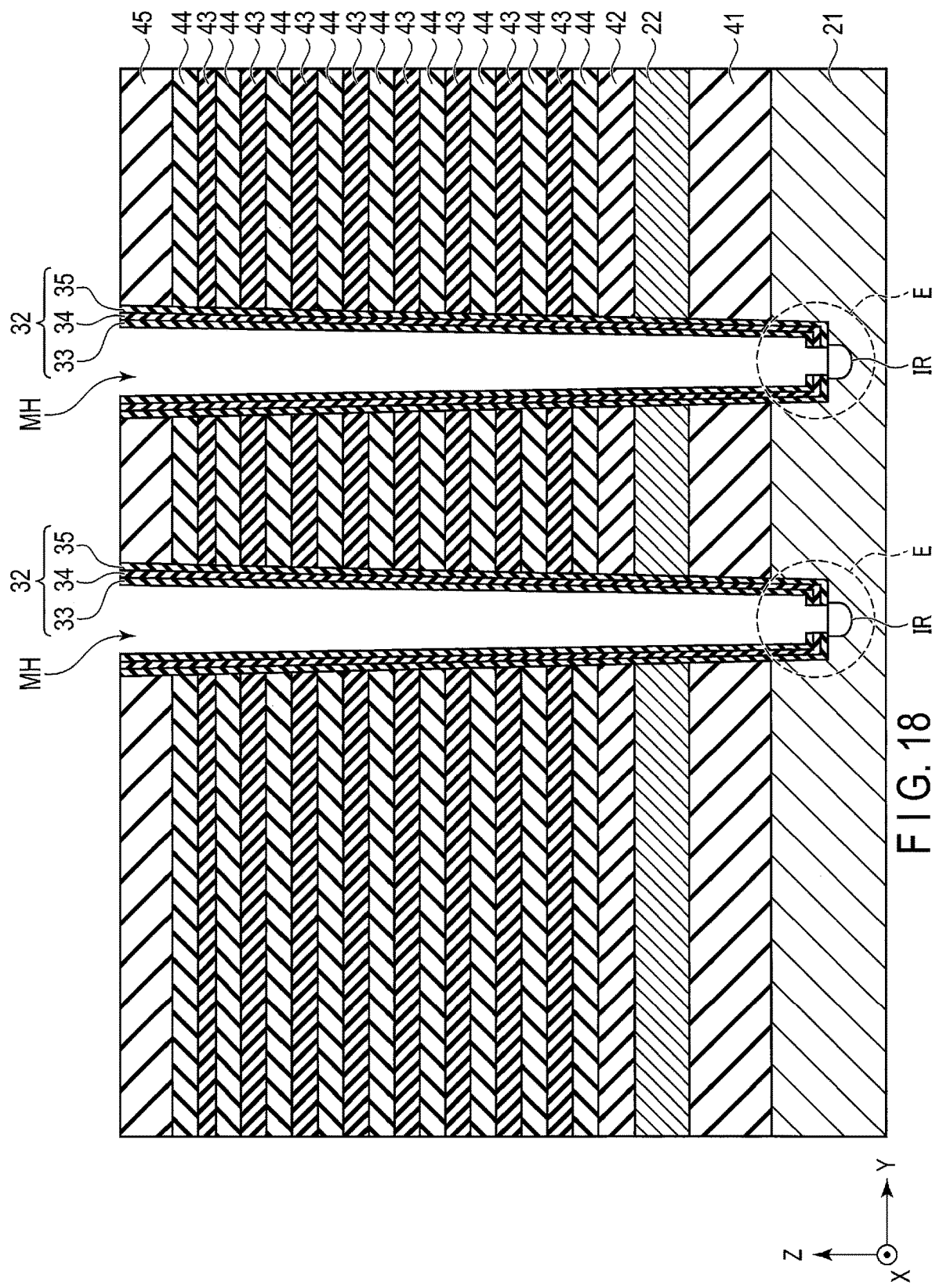
FIG. 18 is a cross-sectional view of the memory cell array 10 for illustrating a manufacturing step of the semiconductor memory device 1 according to the embodiment.

Next, the sacrificial member 48 in the memory hole MH is removed. Specifically, as shown in FIG. 18, the sacrificial member 48 in the memory hole MH is removed by, for example, wet etching. In the previous step S1010, the ion-implanted region IR was formed in the conductor layer 21 around the bottom surface of the memory hole MH. Therefore, even though wet etching is performed in this step, the portion of the conductor layer 21 where the ion-implanted region IR is formed is prevented from being etched because the portion has been changed to amorphous. Accordingly, adjacent memory holes HM can be prevented from being defective by being joined via the unnecessarily-etched conductor layer 21 (see E in the figure).

[Step S1012]

Figure 19:
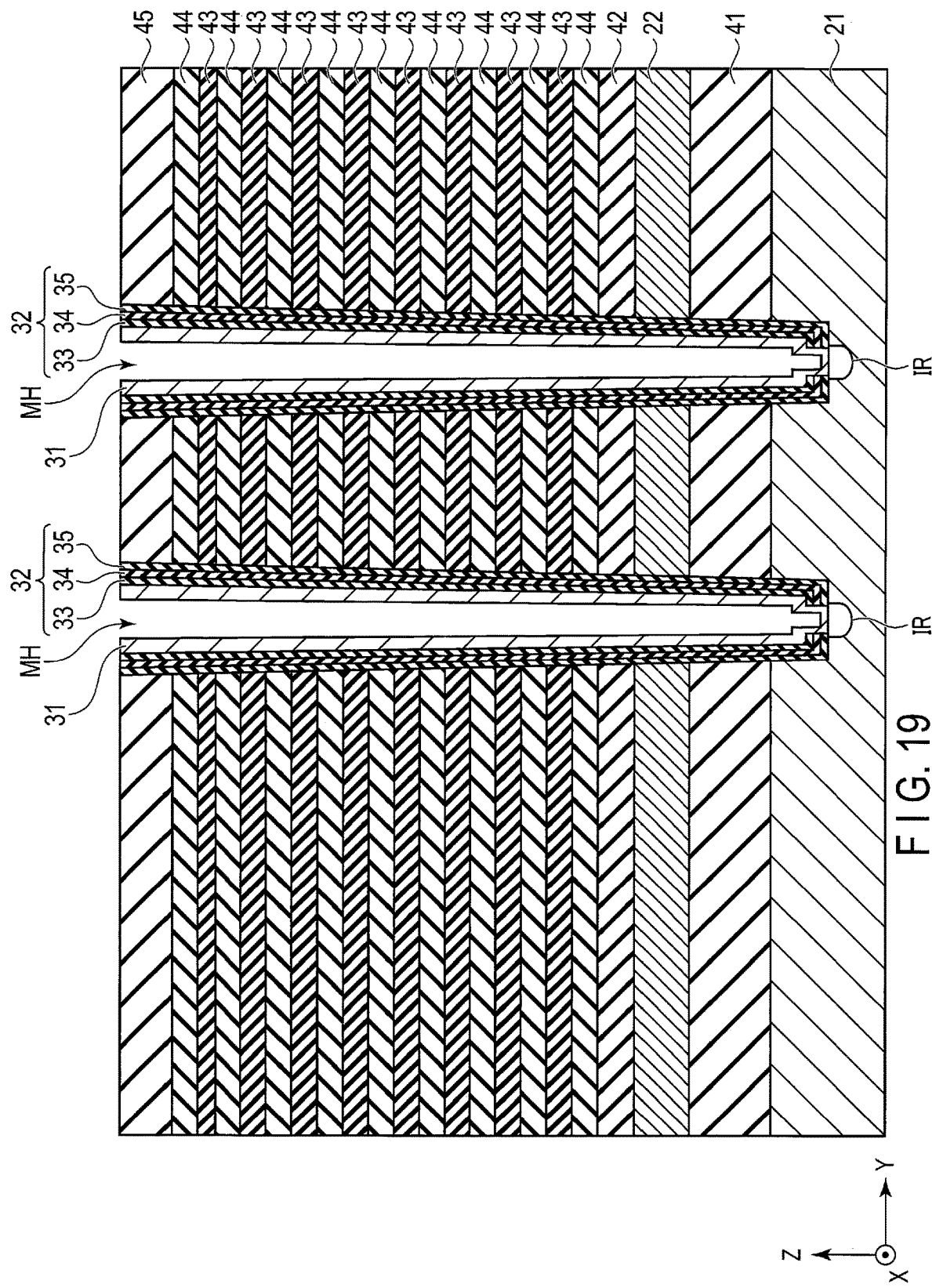
FIG. 19 is a cross-sectional view of the memory cell array 10 for illustrating a manufacturing step of the semiconductor memory device 1 according to the embodiment.

Next, a semiconductor layer 31 is formed. Specifically, as shown in FIG. 19, a semiconductor layer 31 is formed in the memory hole MH. Phosphorus (P) included in the conductor layer 21 may diffuse to the conductor layer 22, etc. via the semiconductor layer 31. However, phosphorus (P) can be prevented from diffusing by implanting carbon (C) or boron (B) in the conductor layer 21 around the bottom surface of the memory hole MH in step S1010. Diffusion of phosphorus (P) to the conductor layer 22 may deteriorate the cut-off characteristics of select gate line SGS. However, by preventing phosphorus (P) from diffusing, deterioration of the cut-off characteristics of select gate line SGS can be prevented.

[Step S1013]

Figure 20:
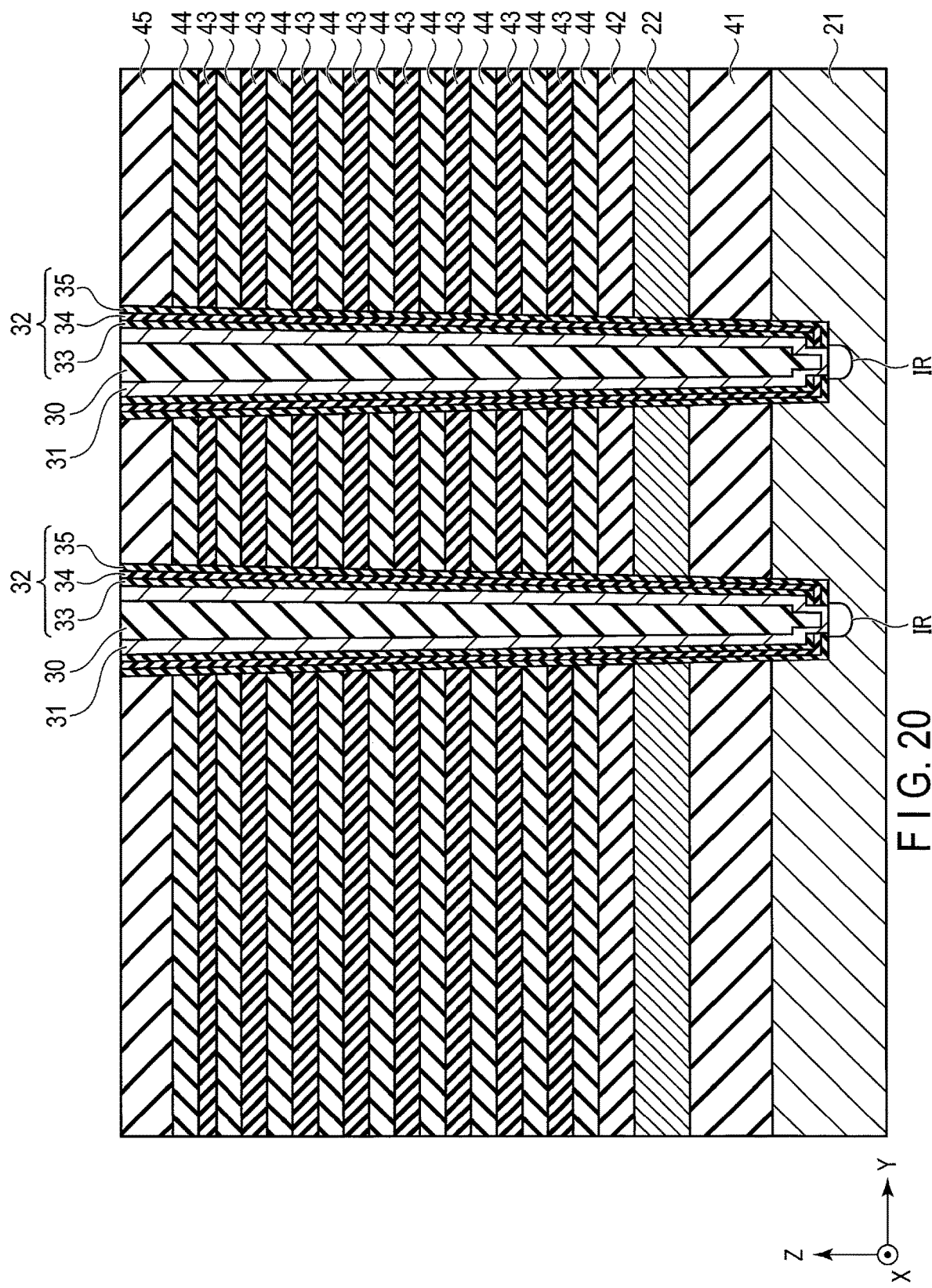
FIG. 20 is a cross-sectional view of the memory cell array 10 for illustrating a manufacturing step of the semiconductor memory device 1 according to the embodiment.

Next, a core member 30 is formed. Specifically, as shown in FIG. 20, the memory hole MH is filled with an insulator (core member 30).

[Step S1014]

Figure 21:
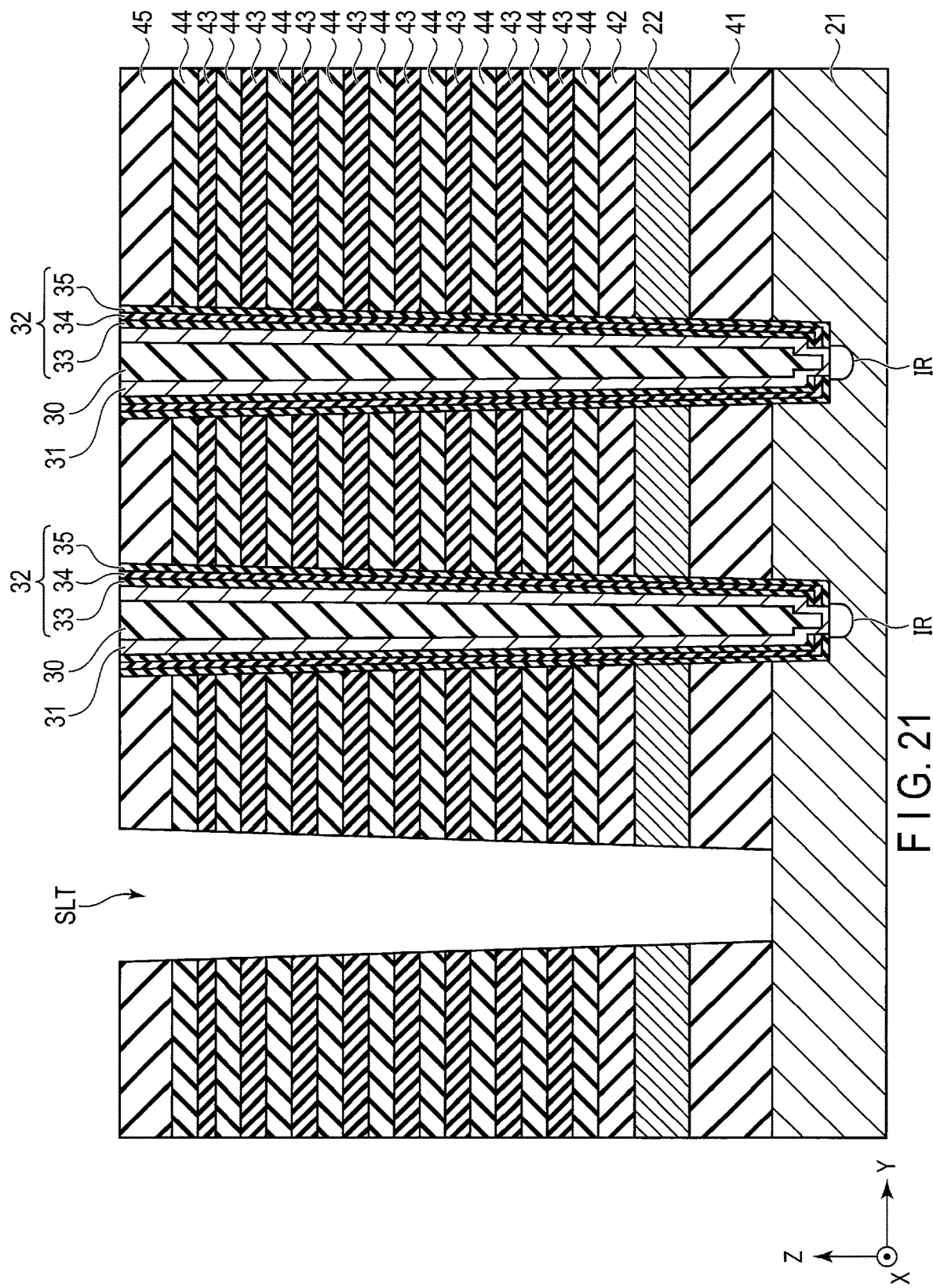
FIG. 21 is a cross-sectional view of the memory cell array 10 for illustrating a manufacturing step of the semiconductor memory device 1 according to the embodiment.

Next, a slit SLT is formed. Specifically, a mask (not shown) including an opening corresponding to a slit SLT is formed by, for example, photolithography. Then, as shown in FIG. 21, a slit SLT is formed by anisotropic etching using the formed mask.

The slit SLT formed in this step splits each of insulator layers 41, 42, 43, and 45, sacrificial members 44, and conductor layer 22 so that the bottom of the slit. SLT is placed within, for example, the layer in which the conductor layer 21 is provided. The anisotropic etching in this step is, for example, RIE.

The memory pillar MP is electrically coupled to the conductor layer 21. The conductor layer 21 is used as the source line SL.

[Step S1015]

Figure 22:
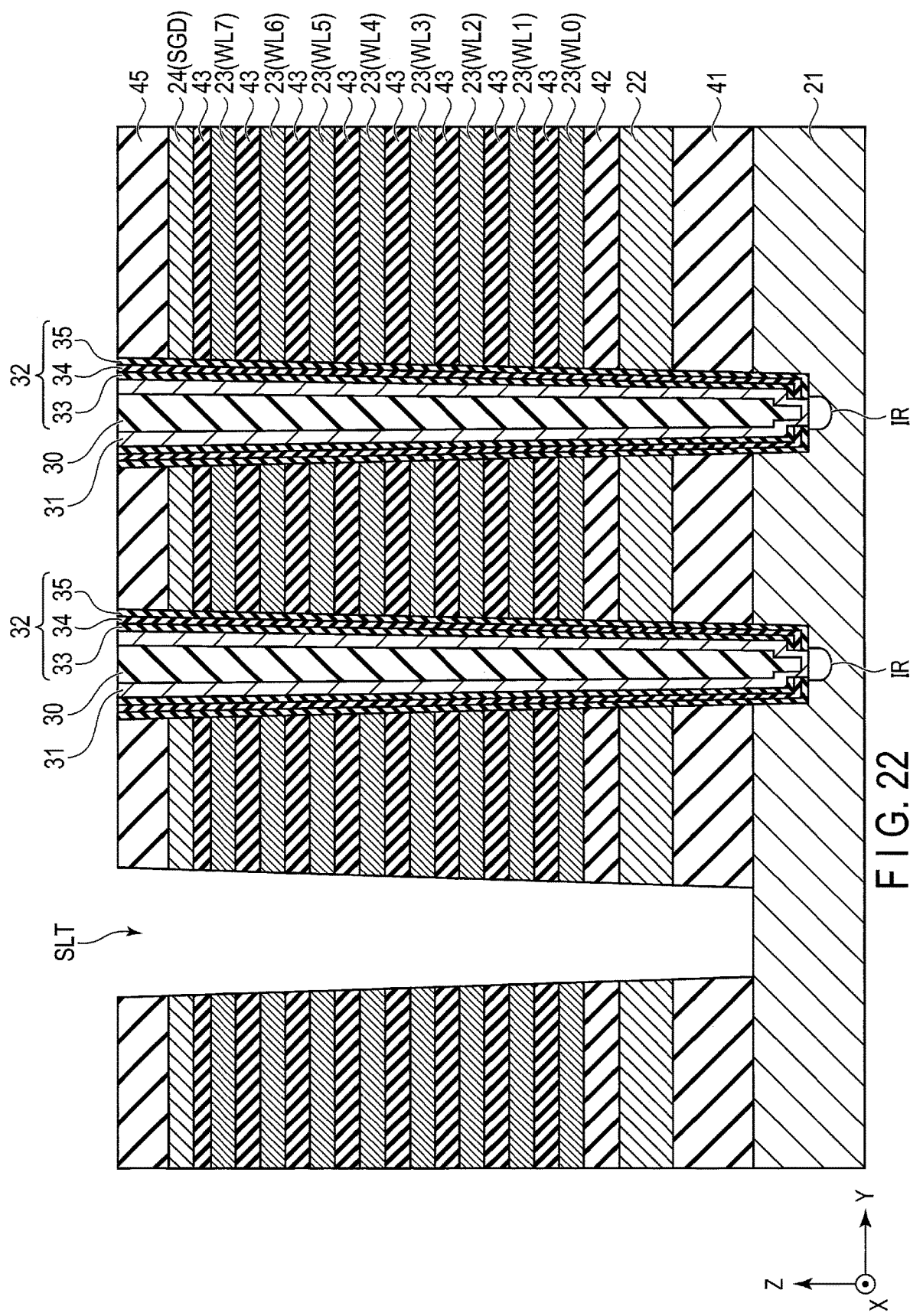
FIG. 22 is a cross-sectional view of the memory cell array 10 for illustrating a manufacturing step of the semiconductor memory device 1 according to the embodiment.

Next, replacement processing for the word line portions and select gate line portions is performed. Specifically, as shown in FIG. 22, the surface of the conductor layer 21 exposed in the slit SLT is oxidized, whereby an oxidized protection film (not shown) is formed. Then, sacrificial members 44 are selectively removed by wet etching using, for example, thermal phosphoric acid. The three-dimensional conformation of the structure from which sacrificial members 44 have been removed is maintained by, for example, a plurality of memory pillars MP.

Then, by, for example, CVD, a conductor is filled in the spaces from which sacrificial members 44 have been removed. After that, the conductor formed in the slit SLT is removed by etch-back processing. Accordingly, a plurality of conductor layers 23 corresponding to word lines WL0 to WL7 and a conductor layer 24 that serves as select gate line SGD are formed. The conductor layers 23 and 24 formed in this step may include a barrier metal. In the formation of a conductor after removal of sacrificial members 44, tungsten (W) is formed after, for example, a film of titanium nitride (TiN) is formed as a barrier metal.

[Step S1016]

Figure 23:
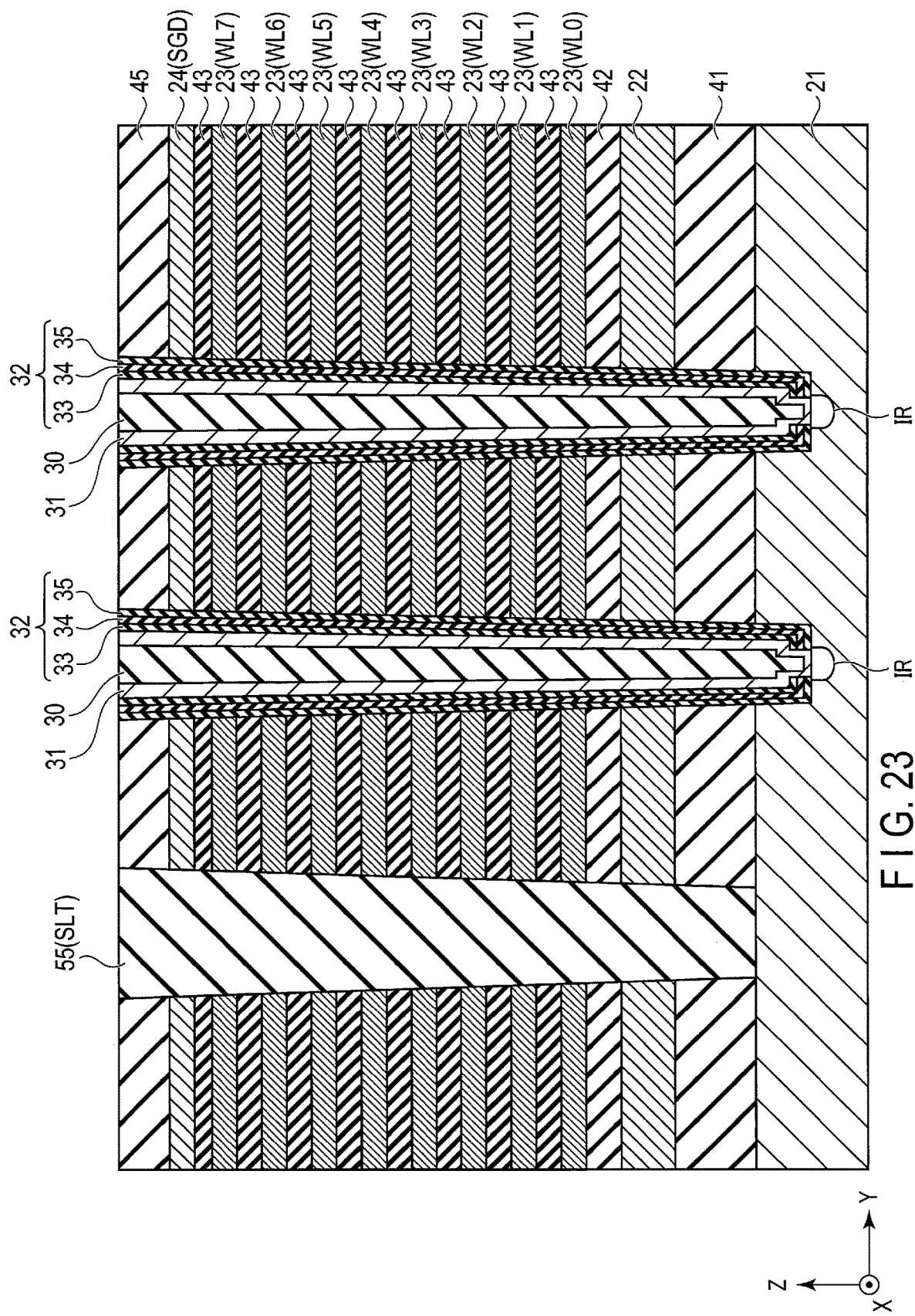
FIG. 23 is a cross-sectional view of the memory cell array 10 for illustrating a manufacturing step of the semiconductor memory device 1 according to the embodiment.

Next, an insulator 55 is formed in the slit SLT. Specifically, as shown in FIG. 23, an insulator 55 is formed on insulator layer 45 and the slit SLT is filled with the insulator 55. Then, the insulator 55 formed outside the slit SLT is removed by, for example, CMP. As a result, a structure in which the slit SLT is filled with the insulator 55 is formed. The insulator 55 includes, for example, silicon oxide (SiO$_2$).

By the above-described manufacturing steps of the semiconductor memory device 1 according to the embodiment, the memory pillar MP, and the source line SL, word lines WL, and select gate lines SGS and SGD, which are coupled to the memory pillar MP, are formed. The above-described manufacturing steps are mere examples. Another step may be interposed between manufacturing steps, and the order of the manufacturing steps may be altered unless a problem occurs.

<1-3> Advantage of Embodiment

Hereinafter, details of the advantage of the semiconductor memory device 1 according to the embodiment will be described.

In a semiconductor memory device in which memory cells are three-dimensionally stacked, a conductor layer 21 made of polysilicon is provided under a memory hole MH. This conductor layer 21 has a high etching rate, and thus may join adjacent memory holes MH when being subject to wet etching or the like. As a result, the quality of the memory pillars MP may deteriorate.

However, according to the above-described embodiment, a given type of ion is doped in the conductor layer 21 before the conductor layer 21 exposed by the memory hole MH is etched by wet etching. The doped region of conductor layer 21 changes to amorphous. As a result, the amorphous region of the conductor layer 21 has a lower etching rate than the non-amorphous region. Accordingly, even if the conductor layer 21 is subjected to wet etching thereafter, the conductor layer 21 is not unnecessarily etched, and the above-described risk can be reduced.

Phosphorus (P) included in the conductor layer 21 may diffuse to the conductor layer 22, etc. via the semiconductor layer 31. Diffusion of phosphorus (P) to the conductor layer 22 may deteriorate the cut-off characteristics of select gate line SGS. However, phosphorus (P) can be prevented from diffusing by implanting carbon (C) or boron (B) in the conductor layer 21. By preventing phosphorus (P) from diffusing, deterioration of the cut-off characteristics of select gate line SGS can be prevented.

When, for example, the ion-implanted region IR in the conductor layer 21 is doped with arsenic or phosphorus (P), the contact resistance is reduced, and the cell current that flows into the memory pillar MP increases.

As described above, by forming an ion-implanted region IR doped with a given type of ion in the conductor layer 21 around the lower part of the memory hole MH, which is a part of the source line, a high-quality semiconductor memory device can be provided.

<2> Other Modifications, Etc

The manufacturing steps described in the above embodiment and modifications are mere examples. Another step may be interposed between manufacturing steps, and the order of the manufacturing steps may be altered as appropriate. Any manufacturing steps of the semiconductor memory device 1 may be adopted as long as the configurations described in the embodiment and modifications can be formed.

According to the above-described embodiment, the ion-implanted region IR is provided in the conductor layer 21 on the lower end of the memory pillar MP. However, as shown in FIGS. 24 and 25, the ion-implanted region IR may be provided in the conductor layer 21 on and around the lower end of the memory pillar MP.

Figure 25:
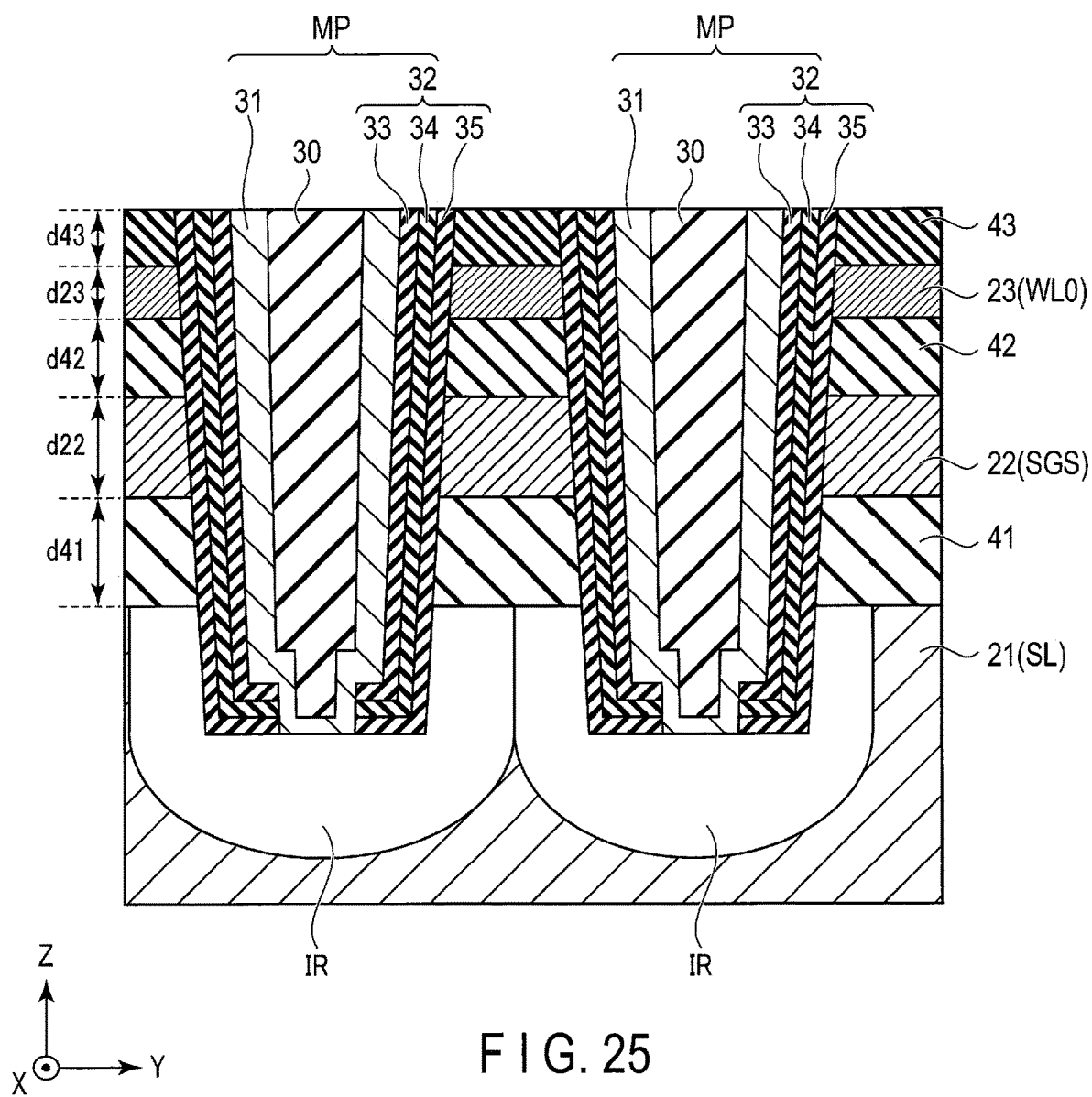
FIG. 25 is a cross-sectional view showing a configuration of area F around a lower end of the memory pillar MP in FIG. 24.

As shown in FIGS. 24 and 25, adjacent ion-implanted regions IR may be in contact with each other.

In the above embodiment, the memory cell array 10 may have a different configuration. For example, the memory pillar MP may have a configuration in which a plurality of pillars are coupled in the Z direction. Alternatively, the memory pillar MP may have a configuration in which a pillar passing through conductor layer 24 (select gate line SGD) is coupled with a pillar passing through a plurality of conductor layers 23 (word lines WL). Alternatively, the memory pillar MP may have a configuration in which a plurality of pillars each passing through a plurality of conductor layers 23 are coupled in the Z direction.

In the above embodiment, the case where the semiconductor memory device 1 has a configuration in which a circuit such as a sense amplifier module 16 is provided under the memory cell array 10 is described as an example; however, the configuration is not limited to this. For example, the semiconductor memory device 1 may have a configuration in which the memory cell array 10 is formed on the semiconductor substrate 20. In this case, semiconductor layer 31 is electrically coupled to the source line SL via, for example, the bottom surface of the memory pillar MP.

The "coupling" herein refers to electrical coupling, and does not exclude, for example, existence of another element between the coupled elements.

The "polysilicon" herein can be reworded as a polycrystalline semiconductor.

While an embodiment has been described, this embodiment has been presented as an example, and is not intended to limit the scope of the invention. This novel embodiment may be embodied in various forms, and various omissions, replacements, and changes can be made thereon without departing from the spirit of the invention. The embodiment and modifications are included in the scope and spirit of the invention and are included in the scope of the claimed inventions and their equivalents.

The invention claimed is:

1. A semiconductor memory device comprising:
   a semiconductor substrate;
   a first conductor layer provided above the semiconductor substrate and including silicon;
   a plurality of second conductor layers provided above first conductor layer and stacked apart from each other in a first direction; and
   a first pillar extending in the first direction through the plurality of second conductor layers and including a first semiconductor layer, the first semiconductor layer including a first portion where the first semiconductor layer faces one of the plurality of second conductor layers, the first portion functioning as a part of a first memory cell transistor,
   wherein the first conductor layer includes a first region which is in contact with the first semiconductor layer and includes at least one first element among arsenic (As), and carbon (C), ; and a second region which is not in contact with the first semiconductor layer and does not include arsenic (As) and carbon (C).

2. The semiconductor memory device according to claim 1, wherein the first region is provided in the first conductor layer in contact with a lower end of the first pillar.

3. The semiconductor memory device according to claim 1, wherein the first region is provided in the first conductor layer on and around a lower end of the first pillar.

4. The semiconductor memory device according to claim 1, wherein adjacent first regions of the first region are in contact with each other.

5. The semiconductor memory device according to claim 1, wherein the first pillar further includes:
   a core member extending in the first direction and covered side and bottom surfaces of the core member by the first semiconductor layer; and
   a laminated film covering a side surface and a part of a bottom surface of the first semiconductor layer.

6. A semiconductor memory device comprising:
   a semiconductor substrate;
   a first conductor layer provided above the semiconductor substrate and including silicon;
   a plurality of second conductor layers provided above first conductor layer and stacked apart from each other in a first direction; and a first pillar extending in the first direction through the plurality of second conductor layers and including a first semiconductor layer, the first semiconductor layer including a first portion where the first semiconductor layer faces one of the plurality of second conductor layers, the first portion functioning as a part of a first memory cell transistor, wherein the first conductor layer includes:
a first region which is in contact with the first semiconductor layer and includes arsenic (As);
a second region which includes the first region and includes carbon (C); and a third region which is not in contact with the first semiconductor layer and does not include arsenic (As) and carbon (C).

7. The semiconductor memory device according to claim 6, wherein the first region is provided in the first conductor layer in contact with a lower end of the first pillar.

8. The semiconductor memory device according to claim 6, wherein the first region is provided in the first conductor layer on and around a lower end of the first pillar.

9. The semiconductor memory device according to claim 6, wherein adjacent first regions of the first region are in contact with each other.

10. The semiconductor memory device according to claim 6, wherein the first pillar includes:
a core member extending in the first direction;
a semiconductor layer covering side and bottom surfaces of the core member and in contact with the first conductor layer; and
a laminated film covering side and bottom surfaces of the semiconductor layer.

11. The semiconductor memory device according to claim 1, wherein the first region further includes at least one of phosphorus (P) and boron (B).

12. The semiconductor memory device according to claim 6, wherein the first region further includes phosphorus (P) and the second region further includes boron (B).

* * * * *